(12) United States Patent
Goto et al.

(10) Patent No.: US 12,206,387 B2
(45) Date of Patent: *Jan. 21, 2025

(54) RAYLEIGH MODE SURFACE ACOUSTIC WAVE RESONATOR

(71) Applicant: Skyworks Solutions, Inc., Irvine, CA (US)

(72) Inventors: Rei Goto, Osaka (JP); Keiichi Maki, Suita (JP)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/309,166

(22) Filed: Apr. 28, 2023

(65) Prior Publication Data

US 2023/0378930 A1 Nov. 23, 2023

Related U.S. Application Data

(63) Continuation of application No. 15/931,342, filed on May 13, 2020, now Pat. No. 11,664,780.

(60) Provisional application No. 62/847,552, filed on May 14, 2019, provisional application No. 62/847,535, filed on May 14, 2019.

(51) Int. Cl.
*H03H 9/02* (2006.01)
*H03H 9/145* (2006.01)
*H03H 9/25* (2006.01)

(52) U.S. Cl.
CPC .... *H03H 9/02834* (2013.01); *H03H 9/02559* (2013.01); *H03H 9/145* (2013.01); *H03H 9/25* (2013.01)

(58) Field of Classification Search
CPC ......... H03H 9/02559; H03H 9/02574; H03H 9/02834; H03H 9/02866; H03H 9/145; H03H 9/14541; H03H 9/25
USPC ........................................................ 310/313
See application file for complete search history.

(56) References Cited

U.S. PATENT DOCUMENTS

| | | |
|---|---|---|
| 5,446,330 A | 8/1995 | Eda et al. |
| 6,310,423 B1 | 10/2001 | Tanaka et al. |
| 7,213,314 B2 | 5/2007 | Abbott et al. |
| 9,413,334 B2 | 8/2016 | Kando |
| 9,431,996 B2 | 8/2016 | Watanabe et al. |
| 10,778,181 B2 * | 9/2020 | Goto ................. H03H 9/02559 |
| 11,664,780 B2 * | 5/2023 | Goto ................. H03H 9/02574 |
| | | 310/313 A |
| 2002/0145489 A1 | 10/2002 | Cornett et al. |

(Continued)

*Primary Examiner* — Tan H Trinh
(74) *Attorney, Agent, or Firm* — Knobbe, Martens, Olson & Bear, LLP

(57) ABSTRACT

Surface acoustic wave resonators are disclosed. In certain embodiments, a surface acoustic wave resonator can include a high impedance layer, a piezoelectric layer over the high impedance layer, an interdigital transducer electrode over the piezoelectric layer, and a low impedance layer between the high impedance layer and the piezoelectric layer. An acoustic impedance of the high impedance layer is greater than an acoustic impedance of the piezoelectric layer. An acoustic impedance of the low impedance layer is lower than the acoustic impedance of the high impedance layer. The piezoelectric layer can have a cut angle in a range from 115° to 135°. The surface acoustic wave resonator is configured to generate a Rayleigh mode surface acoustic wave having a wavelength of λ.

20 Claims, 26 Drawing Sheets

(56) References Cited

U.S. PATENT DOCUMENTS

| | | |
|---|---|---|
| 2003/0020565 A1 | 1/2003 | Cornett et al. |
| 2006/0238067 A1 | 10/2006 | Dausch |
| 2008/0297281 A1 | 12/2008 | Ayazi et al. |
| 2009/0170186 A1 | 7/2009 | Wu et al. |
| 2015/0270824 A1 | 9/2015 | Sauer et al. |
| 2016/0365842 A1* | 12/2016 | Marksteiner ............ H03H 9/54 |
| 2018/0159494 A1 | 6/2018 | Goto et al. |
| 2018/0159507 A1* | 6/2018 | Goto ................. H03H 9/02818 |
| 2019/0170631 A1 | 6/2019 | Shachar et al. |
| 2019/0238111 A1* | 8/2019 | Iwaki ....................... H03H 9/25 |
| 2020/0021272 A1* | 1/2020 | Segovia Fernandez ..................... H03B 5/326 |
| 2021/0034935 A1 | 2/2021 | Ballandras et al. |
| 2022/0094336 A1 | 3/2022 | O'Brien et al. |

\* cited by examiner

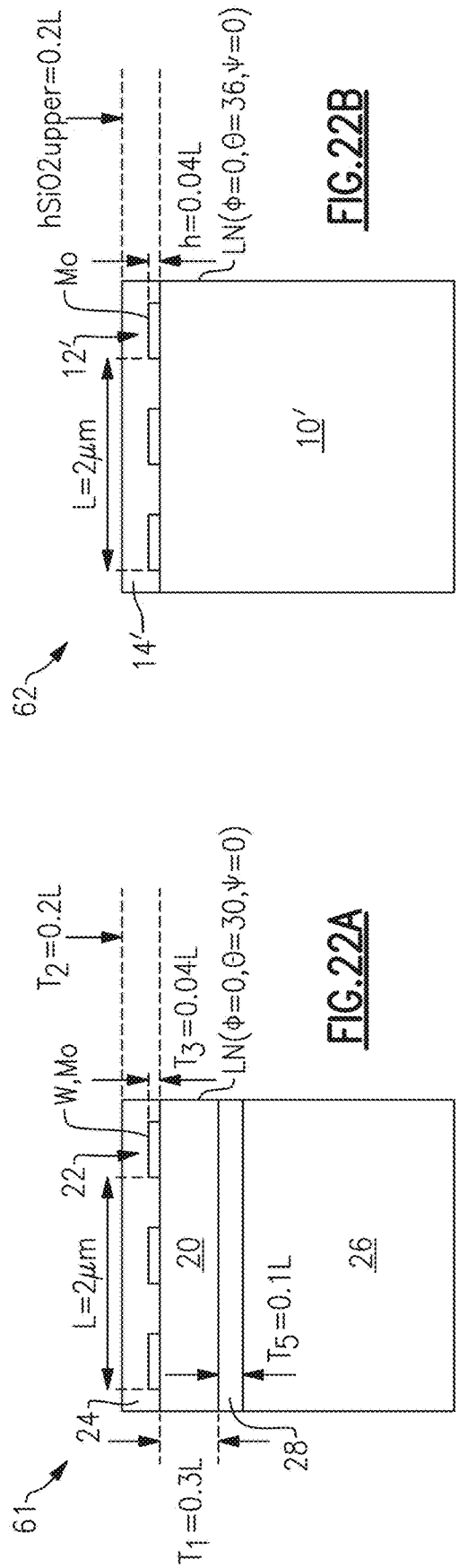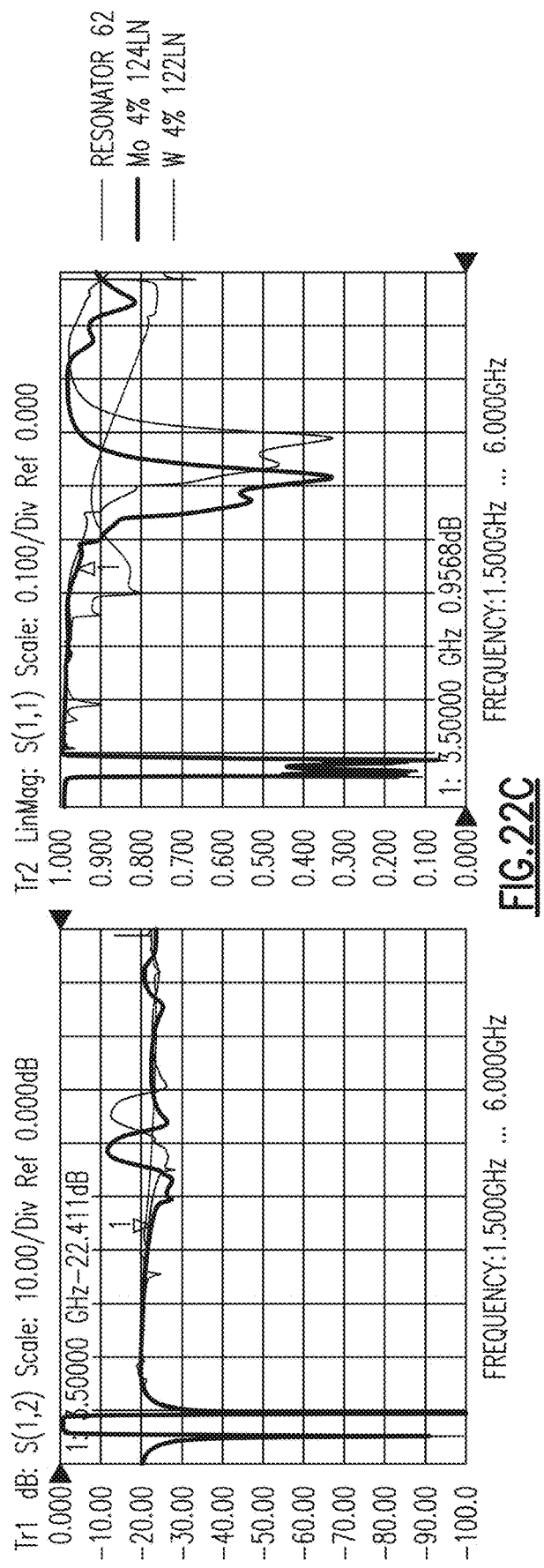
FIG.22A
FIG.22B
FIG.22C

RAYLEIGH MODE SURFACE ACOUSTIC WAVE RESONATOR

CROSS REFERENCE TO PRIORITY APPLICATIONS

This application is a continuation of U.S. patent application Ser. No. 15/931,342, filed on May 13, 2020, and titled "RAYLEIGH MODE SURFACE ACOUSTIC WAVE RESONATOR", which claims the benefit of priority of U.S. Provisional Patent Application No. 62/847,552, filed May 14, 2019 and titled "RAYLEIGH MODE ACOUSTIC WAVE RESONATOR," and U.S. Provisional Patent Application No. 62/847,535, filed May 14, 2019 and titled "RAYLEIGH MODE SURFACE ACOUSTIC WAVE RESONATOR," the disclosures of each of which are hereby incorporated by reference in their entireties herein.

BACKGROUND

Technical Field

Embodiments of this disclosure relate to Rayleigh acoustic wave resonators.

Description of Related Technology

Acoustic wave filters can be implemented in radio frequency electronic systems. For instance, filters in a radio frequency front end of a mobile phone can include acoustic wave filters. An acoustic wave filter can filter a radio frequency signal. An acoustic wave filter can be a band pass filter. A plurality of acoustic wave filters can be arranged as a multiplexer. For example, two acoustic wave filters can be arranged as a duplexer.

An acoustic wave filter can include a plurality of resonators arranged to filter a radio frequency signal. Example acoustic wave filters include surface acoustic wave (SAW) filters and bulk acoustic wave (BAW) filters. A surface acoustic wave resonator can include an interdigital transducer electrode on a piezoelectric substrate. The surface acoustic wave resonator can generate a surface acoustic wave on a surface of the piezoelectric layer on which the interdigital transductor electrode is disposed.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

In one aspect, a surface acoustic wave resonator is disclosed. The surface acoustic wave resonator can include a high impedance layer, a piezoelectric layer positioned over the high impedance layer, a low impedance layer positioned between the high impedance layer and the piezoelectric layer, and an interdigital transducer electrode. The piezoelectric layer has a cut angle in a range from 115° to 135°. An acoustic impedance of the high impedance layer is greater than an acoustic impedance of the piezoelectric layer. An acoustic impedance of the low impedance layer is lower than the acoustic impedance of the high impedance layer. The surface acoustic wave resonator configured to generate a Rayleigh mode surface acoustic wave having a wavelength of $\lambda$.

In an embodiment, the piezoelectric layer has a thickness in a range from $0.1\lambda$ to $0.5\lambda$.

In an embodiment, the low impedance layer has a thickness in a range from $0.01\lambda$ to $0.3\lambda$.

In an embodiment, the low impedance layer is a silicon dioxide layer.

In an embodiment, the surface acoustic wave resonator further includes temperature compensating layer that is positioned over the interdigital transducer electrode. The temperature compensating layer can be a silicon dioxide layer. The surface acoustic wave resonator can further include a silicon nitride layer that is positioned over the temperature compensating layer.

In an embodiment, the interdigital transducer electrode includes two layers. One of the two layers can include aluminum. The other of the two layers can include molybdenum.

In an embodiment, the piezoelectric layer includes lithium niobate.

In an embodiment, the acoustic impedance of the high impedance layer is higher than an acoustic impedance of silicon dioxide, and the high impedance layer includes at least one of silicon, aluminum nitride, silicon nitride, sapphire, spinel, or high impedance glass.

In an embodiment, a reflection coefficient of the surface acoustic wave resonator is at least 0.9 for a frequency range from 2 GHz to 3.75 GHz.

In an embodiment, a reflection coefficient of the surface acoustic wave resonator is at least 0.9 for a frequency range from above a passband of a filter that includes the surface acoustic wave resonator to 3.75 GHz.

In one aspect, a surface acoustic wave resonator is disclosed. The surface acoustic wave resonator can include a high impedance layer, a lithium niobate layer that is positioned over the high impedance layer, a silicon dioxide layer that is positioned between the high impedance layer and the lithium niobate layer, and an interdigital transducer electrode that is positioned over the lithium niobate layer. The lithium niobate layer has a cut angle in a range from 115° to 135°. An acoustic impedance of the high impedance layer is greater than an acoustic impedance of the lithium niobate layer. An acoustic impedance of the silicon dioxide layer is lower than the acoustic impedance of the high impedance layer. An interdigital transducer electrode is positioned over the lithium niobate layer. The surface acoustic wave resonator is configured to generate a Rayleigh mode surface acoustic wave having a wavelength of $\lambda$.

In as embodiments, the piezoelectric layer has a thickness in a range from $0.1\lambda$ to $0.5\lambda$.

In as embodiments, the silicon dioxide layer has a thickness in a range from $0.01\lambda$ to $0.3\lambda$.

In as embodiments, the surface acoustic wave resonator further includes a temperature compensating layer over the interdigital transducer electrode, the temperature compensating layer is a second silicon dioxide layer. The surface acoustic wave resonator can further include a silicon nitride layer over the temperature compensating layer.

In as embodiments, the interdigital transducer electrode includes an aluminum layer and a molybdenum layer.

In as embodiments, a reflection coefficient of the surface acoustic wave resonator is at least 0.9 for a frequency range from 2 GHz to 3.75 GHz.

In as embodiments, a reflection coefficient of the surface acoustic wave resonator is at least 0.9 for a frequency range from above a pass band of a filter that includes the surface acoustic wave resonator to 3.75 GHz.

In one aspect, a surface acoustic wave resonator is disclosed. The surface acoustic wave resonator can include a high impedance layer, a piezoelectric layer that is positioned over the high impedance layer, a low impedance layer that is positioned between the high impedance layer and the piezoelectric layer, and an interdigital transducer electrode that is positioned over the piezoelectric layer. An acoustic impedance of the high impedance layer is greater than an acoustic impedance of the piezoelectric layer. An acoustic impedance of the low impedance layer is lower than the acoustic impedance of the high impedance layer. The surface acoustic wave resonator is configured to generate a Rayleigh mode surface acoustic wave having a wavelength of $\lambda$.

In one aspect, a Rayleigh mode surface acoustic wave resonator is disclosed. The Rayleigh mode surface acoustic wave resonator can include a high impedance layer, a piezoelectric layer that is positioned over the high impedance layer, an interdigital transducer electrode that is positioned over the piezoelectric layer, a temperature compensating layer that is positioned over the interdigital transducer electrode, and a low impedance layer that is positioned between the high impedance layer and the piezoelectric layer. An acoustic impedance of the high impedance layer is greater than an acoustic impedance of the piezoelectric layer. An acoustic impedance of the low impedance layer is lower than the acoustic impedance of the high impedance layer. The surface acoustic wave resonator is configured to generate a Rayleigh mode surface acoustic wave having a wavelength $\lambda$.

In an embodiment, the piezoelectric layer has a thickness in a range from $0.1\lambda$ to $0.5\lambda$.

In an embodiment, the piezoelectric layer is a lithium niobate layer. The piezoelectric layer can have a cut angle in a range from 115° to 135°.

In an embodiment, the low impedance layer is a silicon dioxide layer.

In an embodiment, the low impedance layer has a thickness in a range from $0.01\lambda$ to $0.3\lambda$.

In an embodiment, the high impedance layer is a silicon layer.

In an embodiment, wherein the temperature compensating layer is a silicon dioxide layer. The temperature compensating layer can have a thickness in a range from $0.01\lambda$ to $0.4\lambda$.

In an embodiment, the Rayleigh mode surface acoustic wave resonator further includes a silicon nitride layer that is positioned over the temperature compensating layer.

In an embodiment, a reflection coefficient of the surface acoustic wave resonator is at least 0.9 for a frequency range from 2 GHz to 3.75 GHz.

In an embodiment, a reflection coefficient of the surface acoustic wave resonator is at least 0.9 for a frequency range from above a pass band of a filter that includes the Rayleigh mode surface acoustic wave resonator to 3.75 GHz.

In one aspect, a Rayleigh mode surface acoustic wave resonator is disclosed. The Rayleigh mode surface acoustic wave resonator can include a high impedance layer, a lithium niobate layer that is positioned over the high impedance layer, an interdigital transducer electrode over the piezoelectric layer, a first silicon dioxide layer that is positioned over the interdigital transducer electrode; and a second silicon dioxide layer that is positioned between the high impedance layer and the piezoelectric layer. An acoustic impedance of the high impedance layer is greater than an acoustic impedance of the lithium niobate layer. An acoustic impedance of the second silicon dioxide layer is lower than the acoustic impedance of the high impedance layer. The Rayleigh mode surface acoustic wave resonator is configured to generate a Rayleigh mode surface acoustic wave having a wavelength $\lambda$.

In an embodiment, the lithium niobate layer has a thickness in a range from $0.1\lambda$ to $0.5\lambda$.

In an embodiment, the lithium niobate layer has a cut angle in a range from 115° to 135°.

In an embodiment, the second silicon dioxide layer has a thickness in a range from $0.01\lambda$ to $0.4\lambda$.

In an embodiment, the high impedance layer is a silicon layer. The first silicon dioxide layer can have a thickness in a range from $0.01\lambda$ to $0.3\lambda$.

In an embodiment, the Rayleigh mode surface acoustic wave resonator further includes a silicon nitride layer over the temperature compensating layer.

In an embodiment, a reflection coefficient of the surface acoustic wave resonator is at least 0.9 for a frequency range from 2 GHz to 3.75 GHz.

In an embodiment, a reflection coefficient of the surface acoustic wave resonator is at least 0.9 for a frequency range from above a pass band of a filter that includes the Rayleigh mode surface acoustic wave resonator to 3.75 GHz.

In an embodiment, the interdigital transducer electrode includes two layers.

In an embodiment, an acoustic wave filter includes acoustic wave resonators arranged to filter a radio frequency signal. The acoustic wave resonators includes the surface acoustic wave resonator. A front end module can include the acoustic wave filter, other circuitry, and a package that encloses the acoustic wave filter and the other circuitry. The front end module can further include a multi-throw radio frequency switch. The front end module can further include a power amplifier. A wireless communication device can include an antenna and the acoustic wave filter. The surface acoustic wave filter can be arranged to filter a radio frequency signal associated with the antenna.

In one aspect, a surface acoustic wave resonator is disclosed. The surface acoustic wave resonator can include a high impedance layer, a piezoelectric layer that is positioned over the high impedance layer, an interdigital transducer electrode that is positioned over the piezoelectric layer, and a temperature compensating layer that is positioned over the interdigital transducer electrode. The piezoelectric layer has a cut angle in a range from 115° to 135°. An acoustic impedance of the high impedance layer is greater than an acoustic impedance of the piezoelectric layer. The surface acoustic wave resonator is configured to generate a Rayleigh mode surface acoustic wave.

In an embodiment, the surface acoustic wave resonator further includes a low impedance layer that is positioned between the high impedance layer and the piezoelectric layer. An acoustic impedance of the low impedance layer is lower than the acoustic impedance of the high impedance layer. The low impedance layer can be a silicon dioxide layer. The Rayleigh mode surface acoustic wave has a wavelength of $\lambda$. The low impedance layer can have a thickness in a range from $0.01\lambda$ to $0.3\lambda$. The low impedance layer can have a thickness in a range from $0.01\lambda$ to $0.25\lambda$.

In an embodiment, the temperature compensating layer is a silicon dioxide layer and the piezoelectric layer is a lithium niobate layer.

In an embodiment, the Rayleigh mode surface acoustic wave has a wavelength of $\lambda$, and the piezoelectric layer has a thickness in a range from $0.1\lambda$ to $0.5\lambda$. The temperature compensating layer can have a thickness in a range from $0.01\lambda$ to $0.4\lambda$.

In an embodiment, the acoustic impedance of the high impedance layer is higher than an acoustic impedance of silicon dioxide, and the high impedance layer includes at least one of silicon, aluminum nitride, silicon nitride, sapphire, spinel, or high impedance glass.

In an embodiment, the interdigital transducer electrode includes two layers. One of the two layers can include aluminum. The other of the two layers can include molybdenum.

In an embodiment, the piezoelectric layer includes lithium niobate.

In an embodiment, the surface acoustic wave resonator further includes a dispersion adjustment layer that is positioned over the temperature compensating layer. The dispersion adjustment layer can be a silicon nitride layer. The dispersion adjustment layer can include a first portion and a second portion, and the first and second portions of the dispersion adjustment layer can define a trench.

In an embodiment, a reflection coefficient of the surface acoustic wave resonator is at least 0.9 for a frequency range from 2 GHz to 3.75 GHz.

In an embodiment, a reflection coefficient of the surface acoustic wave resonator is at least 0.9 for a frequency range from above a pass band of a filter that includes the surface acoustic wave resonator to 3.75 GHz.

In one aspect, a surface acoustic wave resonator is disclosed. The surface acoustic wave resonator can include a high impedance layer, a lithium niobate layer that is positioned over the high impedance layer, an interdigital transducer electrode that is positioned over the lithium niobate layer, and a silicon dioxide layer that is positioned over the interdigital transducer electrode. The lithium niobate layer has a cut angle in a range from 115° to 135°. An acoustic impedance of the high impedance layer is greater than an acoustic impedance of the lithium niobate layer. The surface acoustic wave resonator is configured to generate a Rayleigh mode surface acoustic wave.

In as embodiment, the surface acoustic wave resonator further includes a low impedance layer that is positioned between the high impedance layer and the piezoelectric layer. An acoustic impedance of the low impedance layer is lower than the acoustic impedance of the high impedance layer. The low impedance layer can be a second silicon dioxide layer. The Rayleigh mode surface acoustic wave has a wavelength of $\lambda$, and the low impedance layer can have a thickness in a range from $0.01\lambda$ to $0.3\lambda$.

In as embodiment, the Rayleigh mode surface acoustic wave has a wavelength of $\lambda$, and the lithium niobate layer has a thickness in a range from $0.1\lambda$ to $0.5\lambda$, and the silicon dioxide layer has a thickness in a range from $0.01\lambda$ to $0.4\lambda$.

In as embodiment, the acoustic impedance of the high impedance layer is higher than an acoustic impedance of silicon dioxide, and the high impedance layer includes at least one of silicon, aluminum nitride, silicon nitride, sapphire, spinel, or high impedance glass.

In as embodiment, the interdigital transducer electrode includes an aluminum layer and a molybdenum layer.

In as embodiment, the surface acoustic wave resonator further includes a silicon nitride layer over the silicon dioxide layer.

In as embodiment, a reflection coefficient of the surface acoustic wave resonator is at least 0.9 in a frequency range from 2 GHz to 3.75 GHz.

In as embodiment, a reflection coefficient of the surface acoustic wave resonator is at least 0.9 in a frequency range from above a pass band of a filter that includes the surface acoustic wave resonator to 3.75 GHz.

In one aspect, a surface acoustic wave resonator is disclosed. The surface acoustic wave resonator can include a high impedance layer, a piezoelectric layer that is positioned over the high impedance layer, an interdigital transducer electrode that is positioned over the piezoelectric layer, and a temperature compensating layer that is positioned over the interdigital transducer electrode. An acoustic impedance of the high impedance layer is greater than an acoustic impedance of the piezoelectric layer. The surface acoustic wave resonator is configured to generate a Rayleigh mode surface acoustic wave.

In one aspect, an acoustic wave filter is disclosed. The acoustic wave filter can include acoustic wave resonators that are arranged to filter a radio frequency signal. The acoustic wave resonators include a surface acoustic wave resonator. A front end module can include the acoustic wave filter, other circuitry, and a package that encloses the acoustic wave filter and the other circuitry. The front end module can further include a multi-throw radio frequency switch. The front end module can further include a power amplifier. A wireless communication device can include an antenna and the acoustic wave filter, The surface acoustic wave filter can be arranged to filter a radio frequency signal associated with the antenna.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

BRIEF DESCRIPTION OF THE DRAWINGS

Embodiments of this disclosure will now be described, by way of non-limiting example, with reference to the accompanying drawings.

FIG. 22A illustrates a cross section of a SAW resonator according to another embodiment.

FIG. 22B illustrates a cross section of a SAW resonator according to another embodiment.

FIG. 22C illustrates graphs showing simulation results of isolation and reflection coefficient on the right for the SAW resonators of FIGS. 22A and 22B.

DETAILED DESCRIPTION OF CERTAIN EMBODIMENTS

Figure 1:
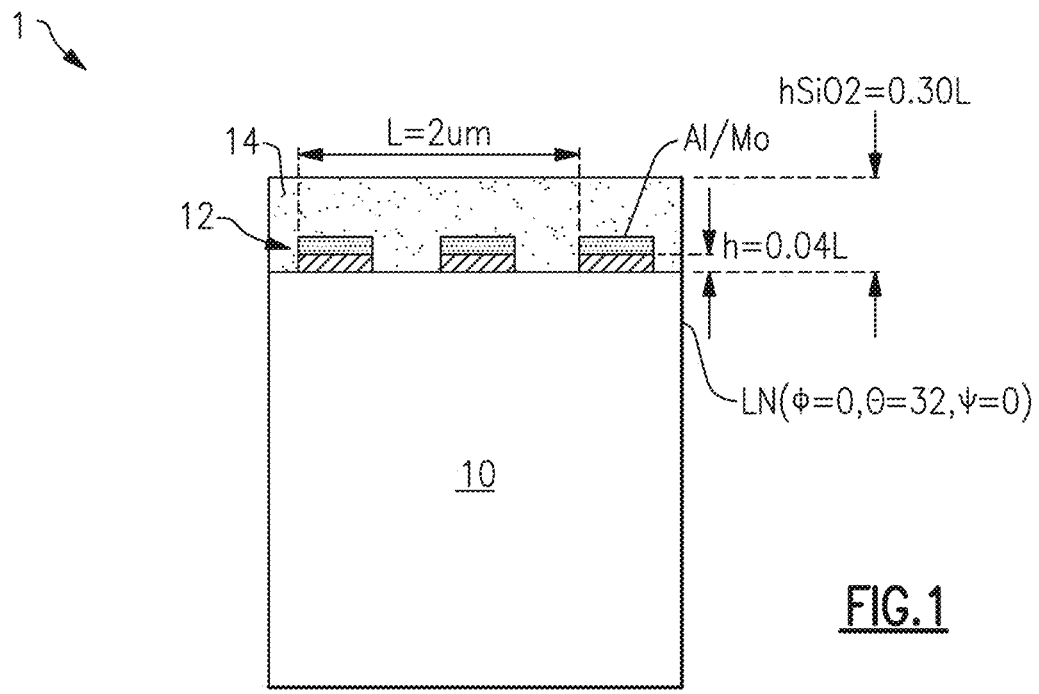
FIG. 1 illustrates a cross section of a surface acoustic wave (SAW) resonator.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Acoustic wave filters can filter radio frequency (RF) signals in a variety of applications, such as in an RF front end of a mobile phone. An acoustic wave filter can be implemented with surface acoustic wave (SAW) devices. Certain SAW devices may be referred as SAW resonators. A SAW resonator can be configured to generate, for example, a Rayleigh mode surface acoustic wave or a shear horizontal mode surface acoustic wave.

Acoustic wave filters can include SAW resonators that include a single layer piezoelectric substrate and an interdigital transducer (IDT) electrode over the single layer piezoelectric substrate. The single layer piezo substrate can consist of a piezoelectric layer. The piezoelectric layer can be a lithium niobate (LN) piezoelectric layer, for example. Such SAW resonators can degrade the reflection coefficient gamma. For example, such SAW resonators can generate higher order response at about 1.3 times and 1.8 times the main resonance. This can lower the reflection coefficient. A multiplexer that includes such SAW resonators may suffer from insertion loss (IL) degradation.

Multi-layer piezoelectric substrate SAW resonators can include a bonded substrate to improve a quality factor (Q) of the resonator. In various instances, such a bonded substrate has caused a reflection at a bonding interface such that a higher-order reflection may occur at a higher frequency and degrade the reflection coefficient. Degradation in the reflection coefficient can result in IL degradation in a multiplexer.

Aspects of this disclosure relate to a SAW resonator with a multi-layer piezoelectric substrate. Multi-layer piezoelectric substrates can provide good thermal dissipation characteristics and improved temperature coefficient of frequency (TCF) relative to certain single layer piezoelectric substrates. For example, certain SAW resonators with a piezoelectric layer on a high impedance layer, such as silicon, can achieve better temperature coefficient of frequency (TCF) and thermal dissipation compared to similar devices without the high impedance layer.

Embodiments of a SAW resonator disclosed herein include a piezoelectric layer that has a cut angle in a range from 115° to 135°. As used herein, a "cut angle" of N° refers to an N° rotated Y-cut in a Y-cut X-propagation piezoelectric layer. For a piezoelectric layer with Euler angles ($\varphi$, $\theta$, $\psi$), the "cut angle" in degrees can be $\theta$ plus 90°. Accordingly, the second Euler angle $\theta$ can be in a range from 25° to 45° when the cut angle is in the range from 115° to 135°. The piezoelectric layer with such cut angle can provide a resonator having less reflection degradation over a relatively broad frequency range as compared to multi-layer piezoelectric substrate with a piezoelectric layer that has other cut angles (e.g., a cut angle in a range from −10° to 60°). The first Euler angle $\varphi$ can be in a range from −10° to +10°. The third Euler angle $\theta$ can be in a range from −10° to +10°. In certain embodiments, the Euler angles ($\varphi$, $\theta$, $\psi$) can be (0°, 25°<$\theta$<45°, 0°).

Embodiments of a SAW resonator disclosed herein can also include a low acoustic impedance layer that has an acoustic impedance lower than that of the high impedance layer. The low acoustic impedance layer can be disposed between the piezoelectric layer and the high impedance layer. Embodiments of a SAW resonator disclosed herein can include a temperature compensation layer over the IDT electrode in addition to or as an alternative to the low acoustic impedance layer.

FIG. 1 illustrates a cross section of a surface acoustic wave (SAW) resonator 1. The illustrated SAW resonator 1 includes an LN layer 10, IDT electrodes 12 over the LN layer 10, and a silicon dioxide (SiO$_2$) layer 14 over the IDT electrodes 12. The LN layer 10 has a cut angle of 122°. The IDT electrode 12 of the SAW resonator 1 has a pitch L that sets the wavelength $\lambda$ of the surface acoustic wave device 1. The pitch L of the illustrated IDT electrode 12 of the SAW resonator 1 is 2 μm. The pitch L is typically equal to the wavelength $\lambda$. A thickness of the LN layer 10 of the SAW resonator 1 can be in a range from 100 μm to 500 μm, for example. In simulations, the LN layer 10 can be modeled has having a semi-infinite thickness. A thickness of the SiO$_2$ layer 14 of the SAW resonator 1 is 0.3 L. The IDT electrode 12 of the SAW resonator 1 is a multi-layer IDT electrode. The IDT electrodes 12 include a molybdenum (Mo) layer and an aluminum (Al) layer over the Mo layer. The Mo layer has a thickness of 0.04 L.

Figure 2:
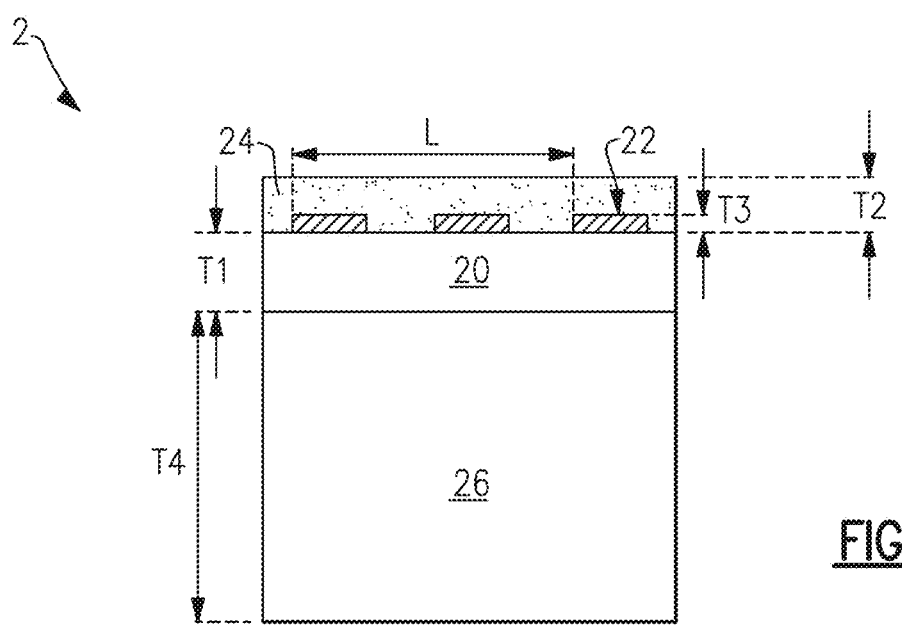
FIG. 2 illustrates a cross section of a SAW resonator according to one embodiment.

FIG. 2 illustrates a cross section of a surface acoustic wave (SAW) resonator 2 according to one embodiment. The SAW resonator 2 includes a piezoelectric layer 20, IDT electrodes 22 over the piezoelectric layer 20, and a temperature compensating layer 24 over the IDT electrodes 22. The SAW resonator 2 also includes a high impedance layer 26 under the piezoelectric layer 20. The SAW resonator 2 can generate a Rayleigh mode surface acoustic wave.

The piezoelectric layer 20 can include any suitable piezoelectric material. For example, the piezoelectric layer 20 can be a lithium niobate (LN) with a cut angle in a range from 115° to 135°. With the cut angle of a piezoelectric layer 20 that is LN being within a range from 115° to 135°, the SAW resonator 2 can generate a Rayleigh mode surface acoustic wave. By contrast, a similar SAW resonator with an LN piezoelectric layer having a cut angle in a range from 20° to 30° can generate a shear horizontal surface acoustic wave and suppress a Rayleigh mode surface acoustic wave. In some embodiments, the piezoelectric layer 20 can be an LN layer with a cut angle of 122°.

The IDT electrodes 22 can include any suitable IDT electrode material. For example, the IDT electrodes 22 can include one or more of an aluminum (Al) layer, a molybdenum (Mo) layer, a tungsten (W) layer, a titanium (Ti) layer, a platinum (Pt) layer, a gold (Au) layer, a silver (Ag) layer, a copper (Cu) layer, a Magnesium (Mg) layer, a ruthenium (Ru) layer, or the like. The IDT electrode 22 may include alloys, such as AlMgCu, AlCu, etc. In some embodiments, the IDT electrodes 22 can be multi-layer IDT electrodes. As an example, a multi-layer IDT electrode can include an Al layer over a Mo layer, or an Al layer over a W layer.

The temperature compensating layer 24 can include any suitable temperature compensating material. For example, the temperature compensating layer 24 can be a silicon dioxide (SiO$_2$) layer. The temperature compensating layer 24 can be a layer of any other suitable material having a positive temperature coefficient of frequency in instances where the piezoelectric layer 20 has a negative temperature coefficient of frequency. For instance, the temperature compensating layer 24 can be a tellurium dioxide (TeO$_2$) layer or a silicon oxyfluoride (SiOF) layer in certain applications. The temperature compensating layer 24 can include any suitable combination of SiO$_2$, TeO$_2$, and/or SiOF. The temperature compensating layer 24 can bring the TCF of the surface acoustic wave resonator 2 closer to zero to thereby provide temperature compensation. The temperature compensating layer 24 can improve the electromechanical coupling coefficient $k^2$ of the SAW resonator 2 relative to a similar SAW resonator without the temperature compensating layer 24. This advantage of the temperature compensating layer 24 can be more pronounced when the piezoelectric layer 20 includes an LN layer.

An acoustic impedance of the high impedance layer 26 can be higher than an acoustic impedance of the piezoelectric layer 20. The acoustic impedance of the high impedance layer 26 can be higher than an acoustic impedance of the temperature compensating layer 24. The high impedance layer 26 can include any suitable material as long as the acoustic impedance of the high impedance layer 26 is higher than at least one of the acoustic impedance of the piezoelectric layer 20 or the acoustic impedance of the temperature compensating layer 24. The acoustic impedance of the high impedance layer 26 can be higher than an acoustic impedance of silicon dioxide. In certain embodiments, the high impedance layer 26 can be a silicon (Si) layer. In some other embodiments, the high impedance layer 26 can include, for example, aluminum nitride (AlN), silicon nitride (SiN), sapphire, spinel, high impedance glass, etc. As discussed with respect to FIG. 3, the high impedance layer 26 together with a particular cut angle of the piezoelectric layer 20 can improve the reflection coefficient of a SAW resonator.

The piezoelectric layer 20 has a thickness T1. The thickness T1 of the piezoelectric layer 20 can be selected based on a wavelength λ or L of a surface acoustic wave generated by the surface acoustic wave resonator 2. The IDT electrode 22 has a pitch that sets the wavelength λ or L of the surface acoustic wave device 2. The piezoelectric layer 20 can be sufficiently thick to provide good coupling factor. A thickness T1 of the piezoelectric layer 20 of at least 0.1 L can be sufficiently thick to mitigate degradation of the coupling factor due to a relatively thin piezoelectric layer 20. The thickness T1 of the piezoelectric layer 20 can be in a range from, for example, 0.1 L to 0.5 L. In some instances, the thickness T1 of the piezoelectric layer 20 can be in a range from 0.3 L to 0.5 L. The wavelength L of the surface acoustic wave can be, for example, 2 μm and the thickness T1 of the piezoelectric layer 20 can be, for example, 0.6 μm, in some embodiments. As noted above, the piezoelectric layer 20 can be an LN layer or any other suitable piezoelectric layer (e.g., a lithium tantalate (LT) layer).

The temperature compensating layer 24 has a thickness T2. In some embodiments, the thickness T2 of the temperature compensating layer 24 can be in a range from 0.01 L to 0.4 L. For example, when the wavelength L is 2 μm, the thickness T2 of the temperature compensating layer 24 can be 0.8 μm.

The IDT electrodes 12 has a thickness T3. In some embodiments, the thickness T3 can be about 0.04 L. In some embodiments, the thickness T3 can be in a range from 0.01 L to 0.08 L. For example, when the wavelength L is 2 μm, the thickness T3 of the Mo layer 18 can be 80 nm.

The high impedance layer 26 has a thickness T4. In some embodiments, the thickness T4 can be determined based at least in part on acoustic energy confirmation. In some embodiments, the thickness T4 can be greater than 10 μm or 1 L. A thickness T4 of at least 10 μm can provide a desired level of mechanical durability. The thickness T4 can be in a range from 10 μm to 1000 μm. The upper bound of the thickness T4 can be based on a final device or module height constraint.

Figure 3:
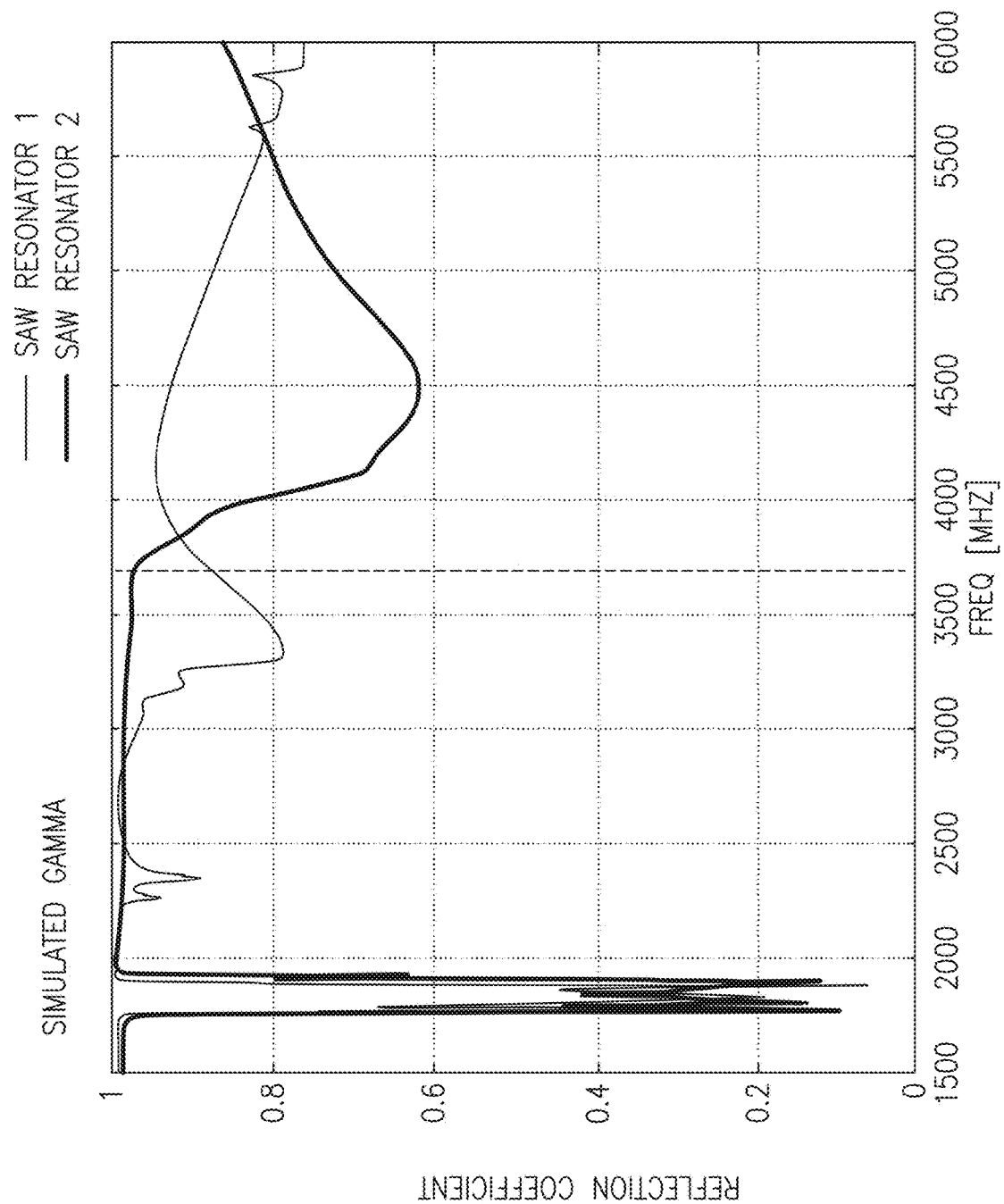
FIG. 3 is a graph showing simulated results of reflection coefficient of the SAW resonator of FIG. 1 and the SAW resonator of FIG. 2.

FIG. 3 is a graph showing simulated results of reflection coefficient s11 (Γ) of the SAW resonator 1 and the SAW resonator 2 illustrated in FIGS. 1 and 2 respectively. A thickness of the LN layer 10 of the SAW resonator 1 is set to a semi-infinite condition in the simulation. The SAW resonator 2 used in the simulation has the following specification: The pitch L is 2 μm; the piezoelectric layer 20 is an LN layer with a cut angle of 122° and the thickness T1 of 0.3 L; the IDT electrodes 22 are Mo electrodes with the thickness T3 of 0.04 L; the temperature compensating layer 24 is a SiO$_2$ layer with the thickness T2 of 0.1 L; and the high impedance layer 26 is a Si layer with the thickness T4 of a semi-infinite condition. In certain instances, the high impedance layer 26 can be a Si layer with a thickness in a range from 10 μm to 1000 μm.

The simulated result of the SAW resonator 1 shows some degradations around 2.4 GHz and 3.4 GHz, while the simulated result of the SAW resonator 2 shows a clean gamma below 3.5 GHz. As shown in FIG. 3, the gamma for the SAW resonator 2 can be relatively high (e.g., more than 0.9 or more than 0.95) for frequencies that are below 3.5 GHz and above a passband of a filter that includes the SAW resonator 2. This improvement in the gamma for the SAW resonator 2 can be due to the high impedance layer 26 together with the cut angle of the piezoelectric layer 20.

Figures 4, 5, 6:
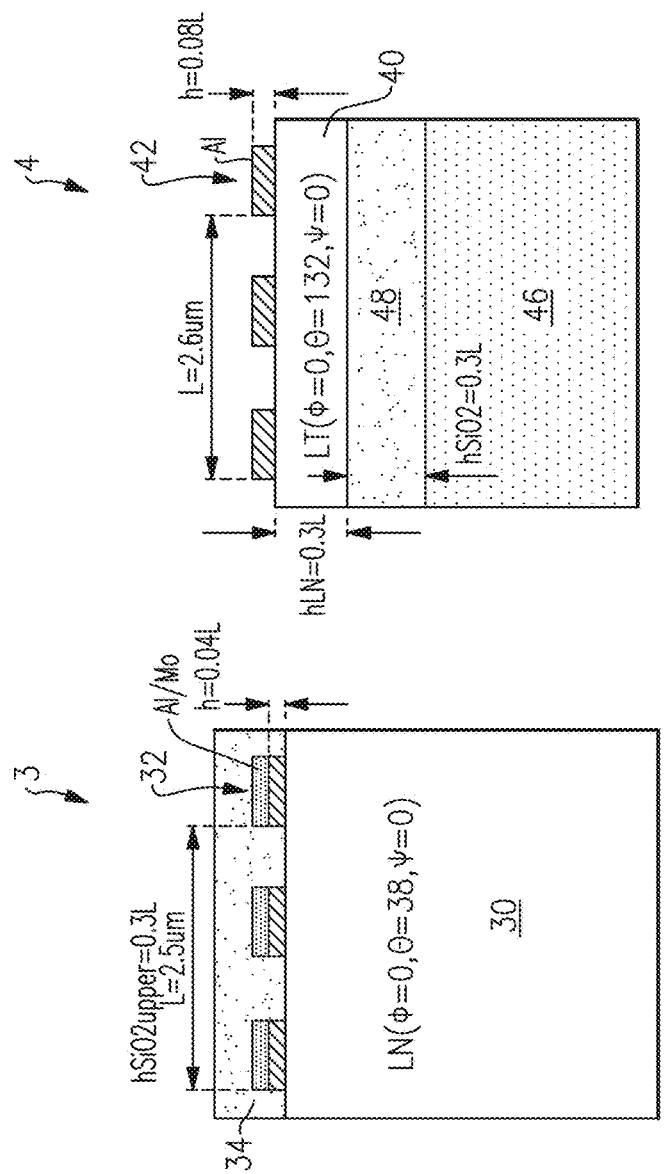
FIG. 4 illustrates a cross section of a SAW resonator.
FIG. 5 illustrates a cross section of a SAW resonator.
FIG. 6 illustrates a cross section of a SAW resonator according to one embodiment.

FIG. 4 illustrates a cross section of a surface acoustic wave resonator 3. The illustrated SAW resonator 3 includes an LN layer 30, IDT electrodes 32 over the LN layer 30, and a SiO$_2$ layer 34 over the IDT electrodes 32. The LN layer 30 has a cut angle of 128°. The IDT electrode 32 of the SAW resonator 3 has a pitch L that sets the wavelength λ of the surface acoustic wave device 3. The pitch L of the illustrated IDT electrode of the SAW resonator 3 is 2.5 μm. A thickness of the SiO$_2$ layer 34 of the SAW resonator 3 is 0.3 L. The IDT electrodes 32 of the SAW resonator 3 is a multi-layer IDS. The IDT electrodes 32 include a molybdenum (Mo) layer and an aluminum (Al) layer over the Mo layer. The Mo layer has a thickness of 0.04 L.

FIG. 5 illustrates a cross section of a surface acoustic wave resonator 4. The illustrated SAW resonator 4 includes a lithium tantalate (LT) layer 40, and IDT electrodes 42 over the LT layer 40. The SAW resonator 4 also includes a Si layer 46 under the LT layer 40 and a SiO$_2$ layer 48 between the LT layer 40 and the Si layer 46. The LT layer 40 has a cut angle of 42°. The IDT electrode 32 of the SAW resonator 4 has a pitch L that sets the wavelength λ of the surface acoustic wave device 4. The pitch L of the illustrated IDT electrode of the SAW resonator 4 is 2.6 μm. A thickness of the LT layer 40 of the SAW resonator 4 is 0.3 L. The IDT electrodes 42 of the SAW resonator 4 are aluminum (Al) electrodes. The IDT electrodes 42 have a thickness of 0.08 L. A thickness of the SiO$_2$ layer 48 of the SAW resonator 4 is 0.3 L.

FIG. 6 illustrates a cross section of a surface acoustic wave resonator 5 according to one embodiment. The SAW resonator 5 is similar to the SAW resonator 2 illustrated in FIG. 2. Unless otherwise noted, the components of FIG. 5 may be similar to or the same as like numbered components of FIG. 2. Like the SAW resonator 2, the SAW resonator 5 includes a piezoelectric layer 20, IDT electrodes 22' over the piezoelectric layer 20, a temperature compensating layer 24 over the IDT electrodes 22, and a high impedance layer 26 under the piezoelectric layer 20. Unlike the SAW resonator 2, the SAW resonator 5 also includes a low impedance layer 28. The SAW resonator 5 can generate Rayleigh mode surface acoustic waves.

Unlike the IDT electrodes 22 of SAW resonator 2, the illustrated IDT electrodes 22' of the SAW resonator 5 are multi-layer IDT electrodes. The IDT electrodes 22' include a bottom layer 23 and an upper layer 25. Like the IDT electrodes 22 of the SAW resonator 2, the IDT electrides 22' of the SAW resonator 5 can include an aluminum (Al) layer, a molybdenum (Mo) layer, a tungsten (W) layer, a titanium (Ti) layer, a platinum (Pt) layer, a gold (Au) layer, a silver (Ag) layer, copper (Cu) layer, a Magnesium (Mg) layer, etc. The IDT electrode 22' may include alloys, such as AlMgCu, AlCu, etc. In certain embodiments, the IDT electrodes 22' can be Al/Mo multi-layer electrodes where the bottom layer 23 is a Mo layer and the upper layer 25 is an Al layer. In some other embodiments, the IDT electrodes 22' can be Al/W multi-layer electrodes where the bottom layer 23 is a W layer and the upper layer 25 is an Al layer. The bottom layer 23 has a thickness T3'. The thickness T3' of the bottom layer 23 can be in a range from 0.01 L to 0.08 L.

An acoustic impedance of the low impedance layer 28 can be lower than the acoustic impedance of the high impedance layer 26. In some embodiments, the low impedance layer can be a silicon dioxide (SiO$_2$) layer. Some low impedance layers, such as an SiO$_2$ layer, can provide a greater adhesion strength between the low impedance layer and the high impedance layer 26 than a adhesion strength between the piezoelectric layer 20 and the high impedance layer 26. As discussed with respect to FIG. 7, the low impedance layer 28 can contribute to improvement in the reflection coefficient of a SAW resonator.

The low impedance layer 28 has a thickness T5. In some embodiments, the thickness T5 of the low impedance layer 28 can be in a rage from 0.01 L to 0.3 L. In some embodiments, the thickness T5 of the low impedance layer 28 can be 0.1 L. When the wavelength is, for example, 2.3 μm, the thickness T5 can be 230 nm.

Figure 7:
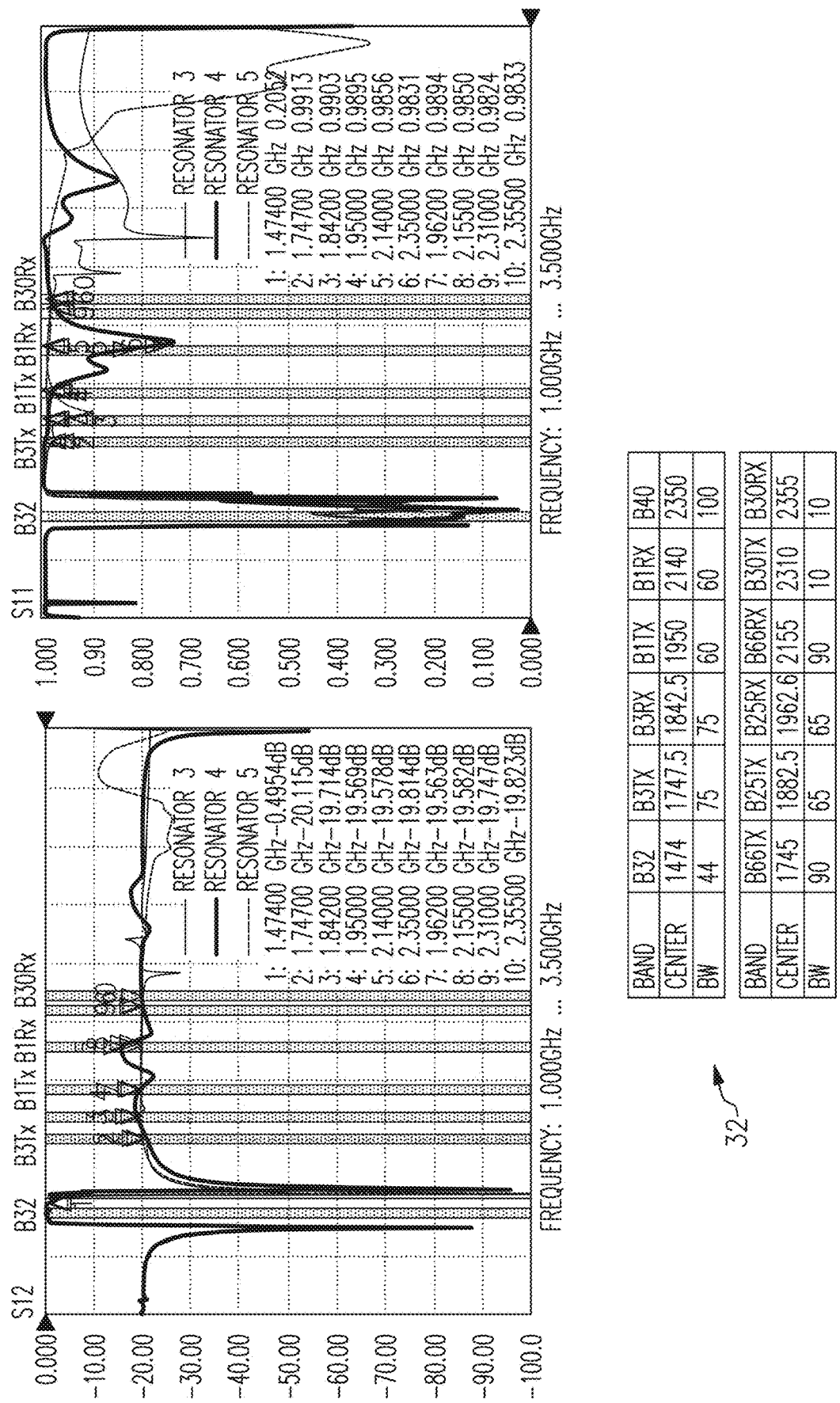
FIG. 7 includes graphs of simulation results of isolation and reflection coefficient for ladder filters using the SAW resonators of FIGS. 4, 5 and 6.

FIG. 7 shows simulation results of isolation s12 in decibels (dB) on the left and reflection coefficient s11 (gamma or Γ) on the right for ladder filters using the SAW resonators 3, 4 and 5 of FIGS. 4, 5 and 6, respectively. The SAW resonator 6 used in the simulation has the following specification: The pitch L is 2.3 μm; the piezoelectric layer 20 is an LN layer with a cut angle of 124° and the thickness T1 of 0.3 L; the IDT electrodes 22' are Al/Mo multi-layer electrodes with the thickness T3' of the Al layer of 0.04 L; the temperature compensating layer 24 is a SiO$_2$ layer with the thickness T2 of 0.2 L; the high impedance layer 26 is a Si layer with the thickness T4 set to a semi-infinite condition; and the low impedance layer 28 is another SiO$_2$ layer with the thickness T5 of 0.1 L.

FIG. 7 includes a chart 32 that shows band names with center frequencies in MHz and bandwidths in MHz. The ladder filters with the SAW resonators 3, 4, and 5 for the simulation results shown in FIG. 7 were Band 32 filters. The simulation results in FIG. 7 indicate that the ladder filter with SAW resonators 5 has the best Γ of the simulated ladder filters. FIG. 7 indicates that Γ for the Band 32 filter with SAW resonators 5 is relatively high for frequencies corresponding to Band 3 transmit, Band 3 receive, Band 1 transmit, Band 1 receive, Band 40, Band 66 transmit, Band 25 transmit, Band 25 receive, Band 66 receive, Band 30 transmit, and Band 30 receive. Accordingly, a Band 32 filter with SAW resonators 5 can be included in a multiplexer with one or more other filters arranged to filter any of the frequency bands shown in chart 32 without significantly degrading insertion loss.

As illustrated in FIG. 7, the Γ of the SAW resonator 3 and the Γ of the SAW resonator 4 degrades at frequency range of between about 1.7 GHz to about 2.5 GHz. On the other hand, the Γ of the SAW resonator 5 is relatively clean at the same frequency range. This improvement in the gamma Γ for the SAW resonator 5 may be due to the high impedance layer 26 and/or the low impedance layer 28 together with the cut angle of the piezoelectric layer.

FIGS. 8A, 9A, 10A, 11A, 12A, 13A, 14A, 15A, 16A, 17A, 18A, 19A, 20A, 21A, and 22A illustrate SAW resonators according to various embodiments. FIGS. 8B, 9B, 10B, 11B, 12B, 13B, 14B, 15B, 16B, 17B, 18B, 19B, 20B, 21B, and 22B illustrate simulation results showing isolation s12 on the left and reflection coefficient s11 (Γ) on the right for the SAW resonators of FIGS. 8A, 9A, 10A, 11A, 12A, 13A, 14A, 15A, 16A, 17A, 18A, 19A, 20A, 21A, and 22A, respectively.

Figure 8A:
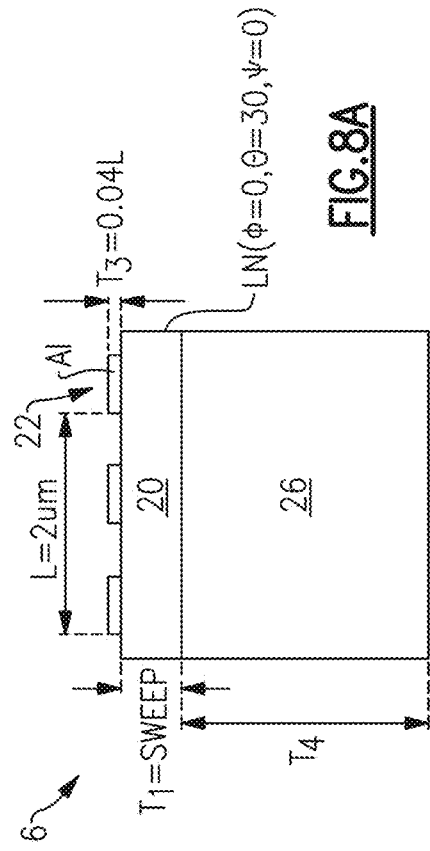
FIG. 8A illustrates a cross section of a SAW resonator.

FIG. 8A illustrates a cross section of a SAW resonator 6. Unless otherwise noted, the components of FIG. 8A may be similar to or the same as like numbered components of FIG. 2. The SAW resonator 6 includes a piezoelectric layer 20, IDT electrodes 22 over the piezoelectric layer 20, and a high impedance layer 26 under the piezoelectric layer 80. Unlike the SAW resonator 2 illustrated in FIG. 2, the SAW resonator 6 does not include the temperature compensating layer 24. The SAW resonator 6 can generate Rayleigh mode surface acoustic waves.

The SAW resonator 6 can have a pitch L of 2 μm, for example. The piezoelectric layer 20 of the SAW resonator 6 illustrated in FIG. 8A is a lithium niobate (LN) layer with a cut angle of 120°. The IDT electrodes 22 of the SAW resonator 6 are aluminum (Al) electrodes with a thickness T3 of 0.04 L. The high impedance layer 26 of the SAW resonator 6 is a silicon (Si) layer with a thickness T4 set to a semi-infinite condition.

Figure 8B:
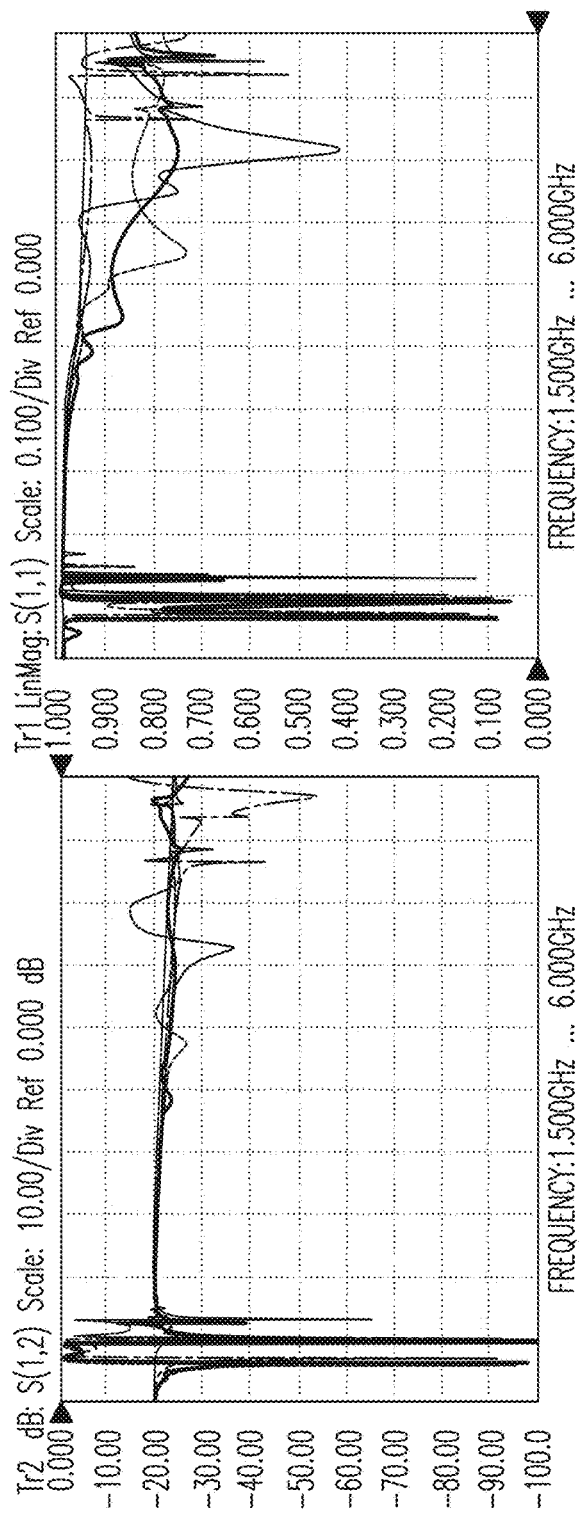
FIG. 8B illustrates graphs showing simulation results of isolation and reflection coefficient for the SAW resonator of FIG. 8A.

FIG. 8B illustrates graphs showing simulation results of isolation s12 on the left and reflection coefficient s11 (Γ) on the right for the SAW resonator 6 of FIG. 8A. The simulation results are for five different thicknesses T1 of the piezoelectric layer 20. The simulations were performed with the thicknesses T1 of 0.1 L, 0.2 L, 0.3 L, 0.4 L, and 0.5 L.

Figure 9A:
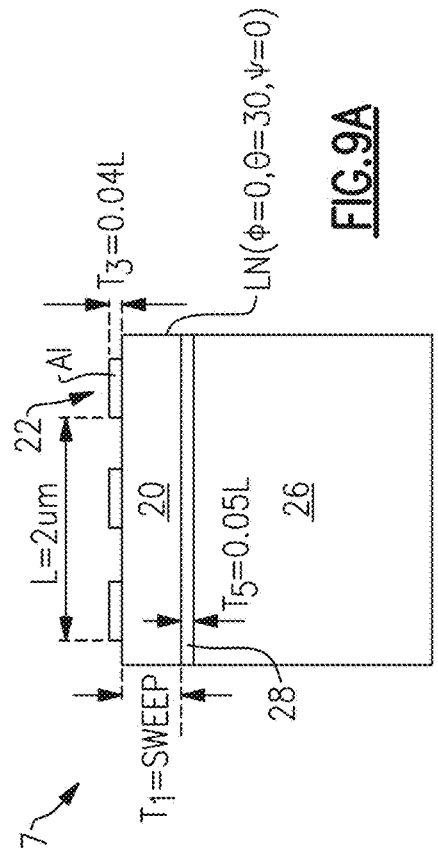
FIG. 9A illustrates a cross section of a SAW resonator according to another embodiment.

FIG. 9A illustrates a cross section of a SAW resonator 7 according to one embodiment. The SAW resonator 7 is like the SAW resonator 6 illustrated in FIG. 8A except that the SAW resonator 7 also includes a low impedance layer 28. The low impedance layer 28 of the SAW resonator 7 illustrated in FIG. 9A is a silicon dioxide (SiO$_2$) layer with a thickness T5 of 0.05 L for the simulation results shown in FIG. 9B.

Figure 9B:
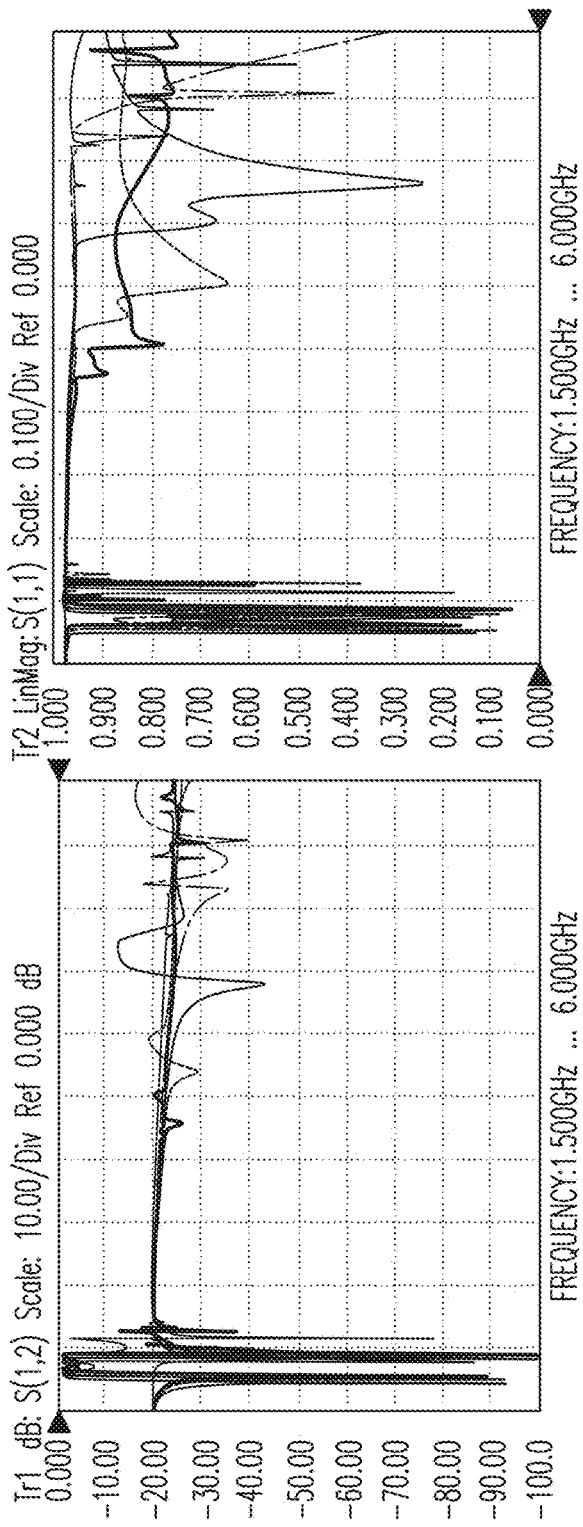
FIG. 9B illustrates graphs showing simulation results of isolation and reflection coefficient for the SAW resonator of FIG. 9A.

FIG. 9B illustrates graphs showing simulation results of isolation s12 on the left and reflection coefficient s11 (Γ) on the right for the SAW resonator 7 of FIG. 9A. The simulation results are for five different thicknesses T1 of the piezoelectric layer 20. The simulations were performed with the thicknesses T1 of 0.1 L, 0.2 L, 0.3 L, 0.4 L, and 0.5 L. As compared to the simulation results of the SAW resonator 6, the Γ is improved in the simulation results of the SAW resonator 7. Accordingly, the low impedance layer 28 can contribute to improved Γ in a Rayleigh mode SAW resonator.

Figure 10A:
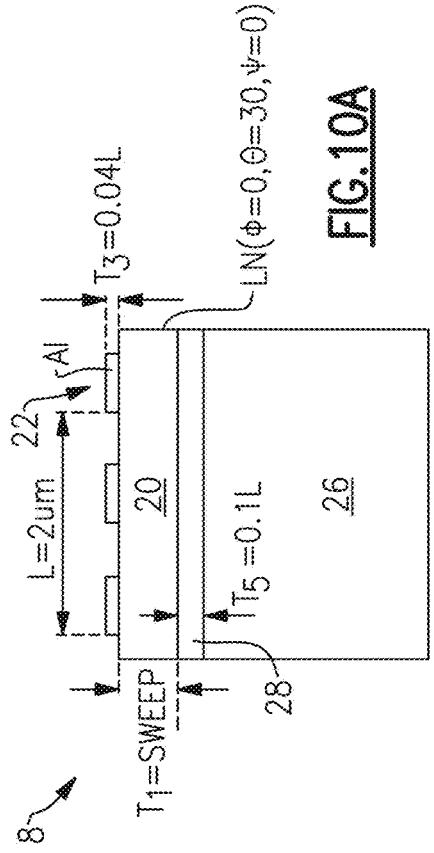
FIG. 10A illustrates a cross section of a SAW resonator according to another embodiment.

FIG. 10A illustrates a cross section of a SAW resonator 8 according to one embodiment. The SAW resonator 8 is like the SAW resonator 7 illustrated in FIG. 9A except that the low impedance layer 28 of the SAW resonator 8 illustrated in FIG. 9A has a thickness T5 of 0.1 L.

Figure 10B:
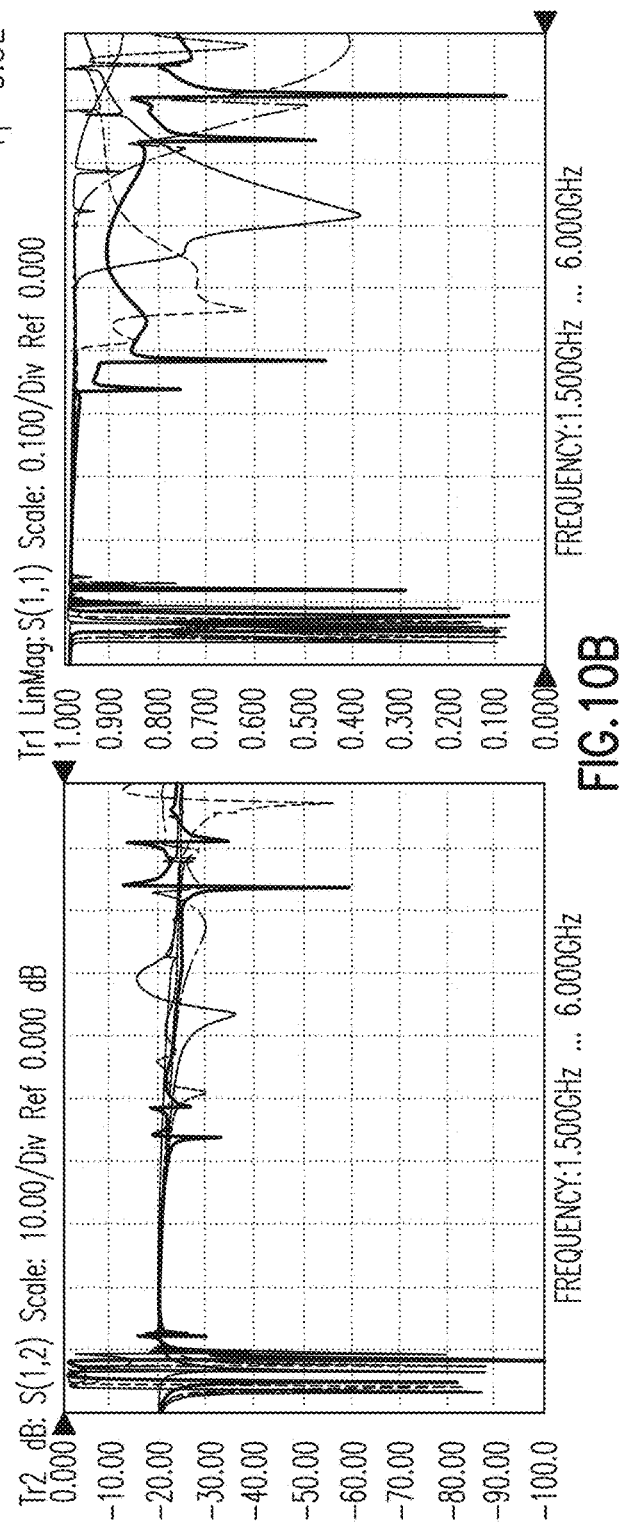
FIG. 10B illustrates graphs showing simulation results of isolation and reflection coefficient for the SAW resonator of FIG. 10A.

FIG. 10B illustrates graphs showing simulation results of isolation s12 on the left and reflection coefficient s11 (Γ) on the right for the SAW resonator 8 of FIG. 10A. The simulation results are for five different thicknesses T1 of the piezoelectric layer 20. The simulations were performed with the thicknesses T1 of 0.1 L, 0.2 L, 0.3 L, 0.4 L, and 0.5 L. As compared to the simulation results of the SAW resonator 6, the Γ is improved in the simulation results of the SAW resonator 8.

Figure 11A:
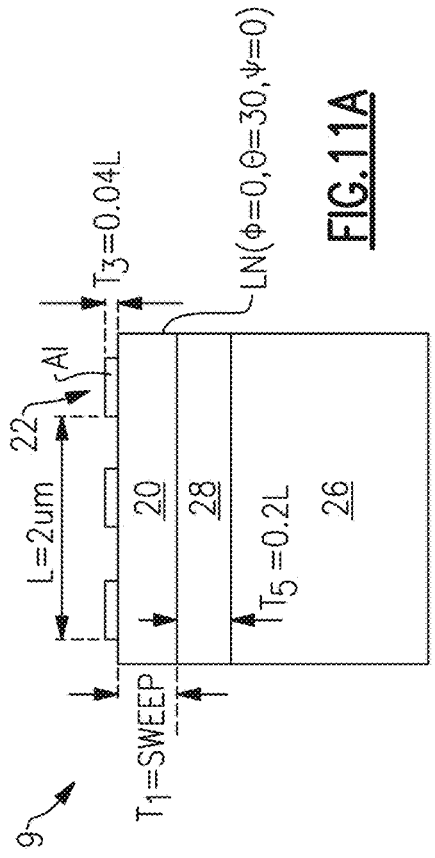
FIG. 11A illustrates a cross section of a SAW resonator according to another embodiment.

FIG. 11A illustrates a cross section of a SAW resonator 9 according to one embodiment. The SAW resonator 9 is like the SAW resonator 7 illustrated in FIG. 9A except that the low impedance layer 28 of the SAW resonator 9 illustrated in FIG. 11A has a thickness T5 of 0.2 L.

Figure 11B:
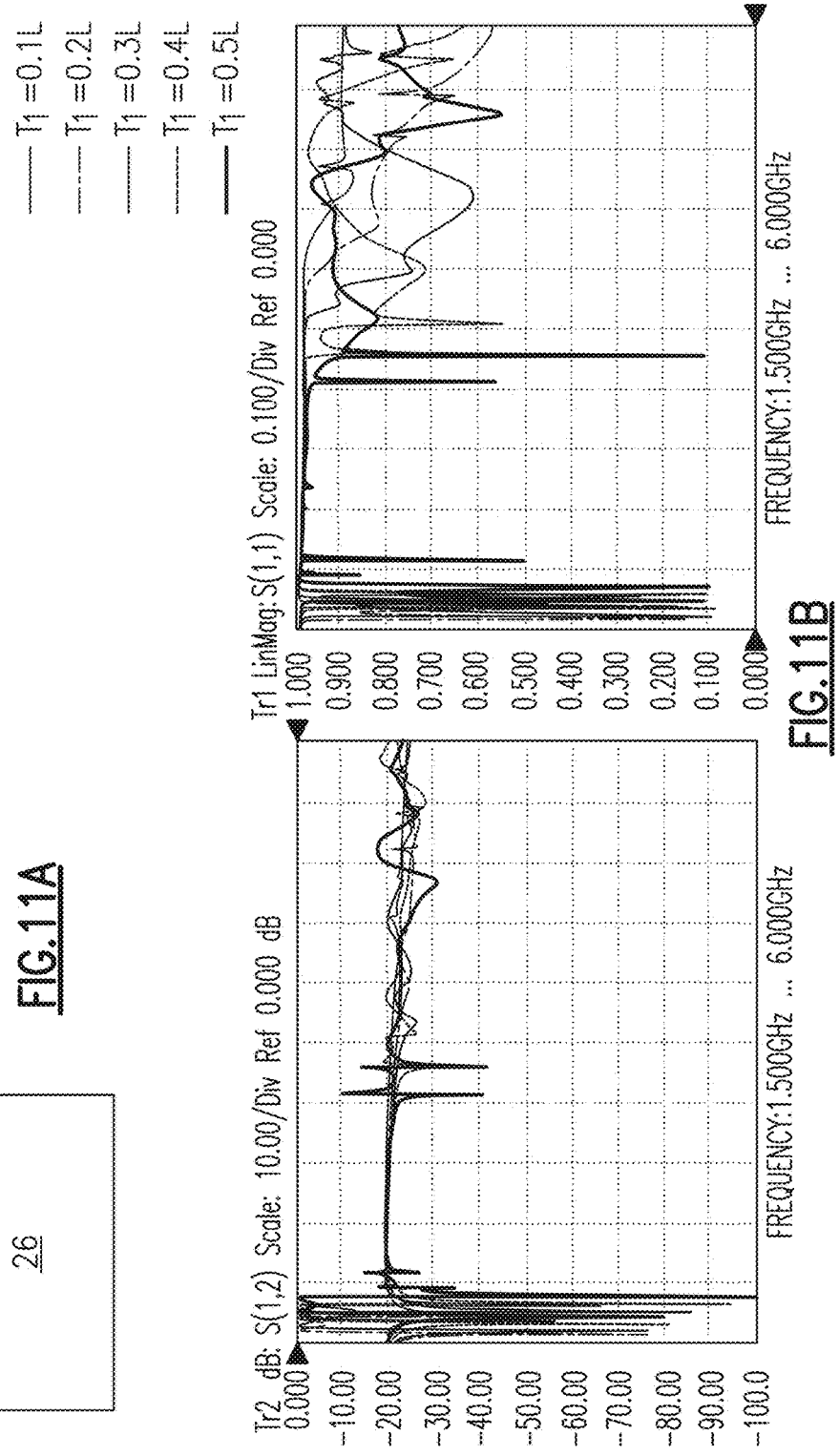
FIG. 11B illustrates graphs showing simulation results of isolation and reflection coefficient for the SAW resonator of FIG. 11A.

FIG. 11B illustrates graphs showing simulation results of isolation s12 on the left and reflection coefficient s11 (Γ) on the right for the SAW resonator 9 of FIG. 11A. The simulation results are for five different thicknesses T1 of the piezoelectric layer 20. The simulations were performed with the thicknesses T1 of 0.1 L, 0.2 L, 0.3 L, 0.4 L, and 0.5 L.

Figure 12A:
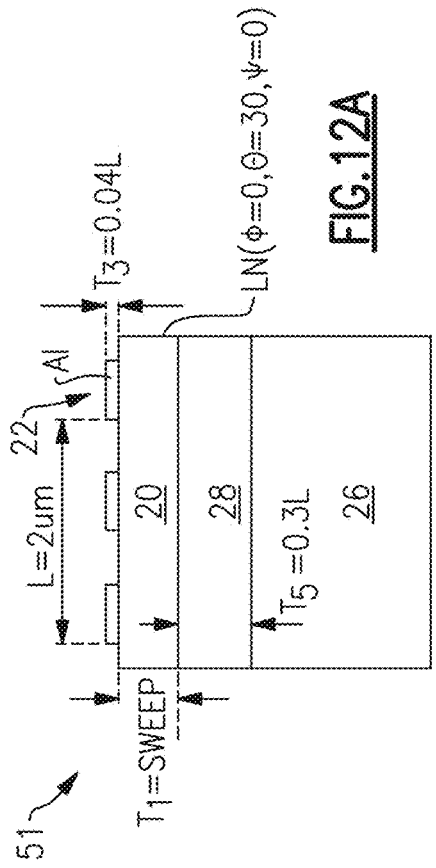
FIG. 12A illustrates a cross section of a SAW resonator according to another embodiment.

FIG. 12A illustrates a cross section of a SAW resonator 51 according to one embodiment. The SAW resonator 51 is like the SAW resonator 7 illustrated in FIG. 9A except that the low impedance layer 28 of the SAW resonator 51 illustrated in FIG. 12A has a thickness T5 of 0.3 L.

Figure 12B:
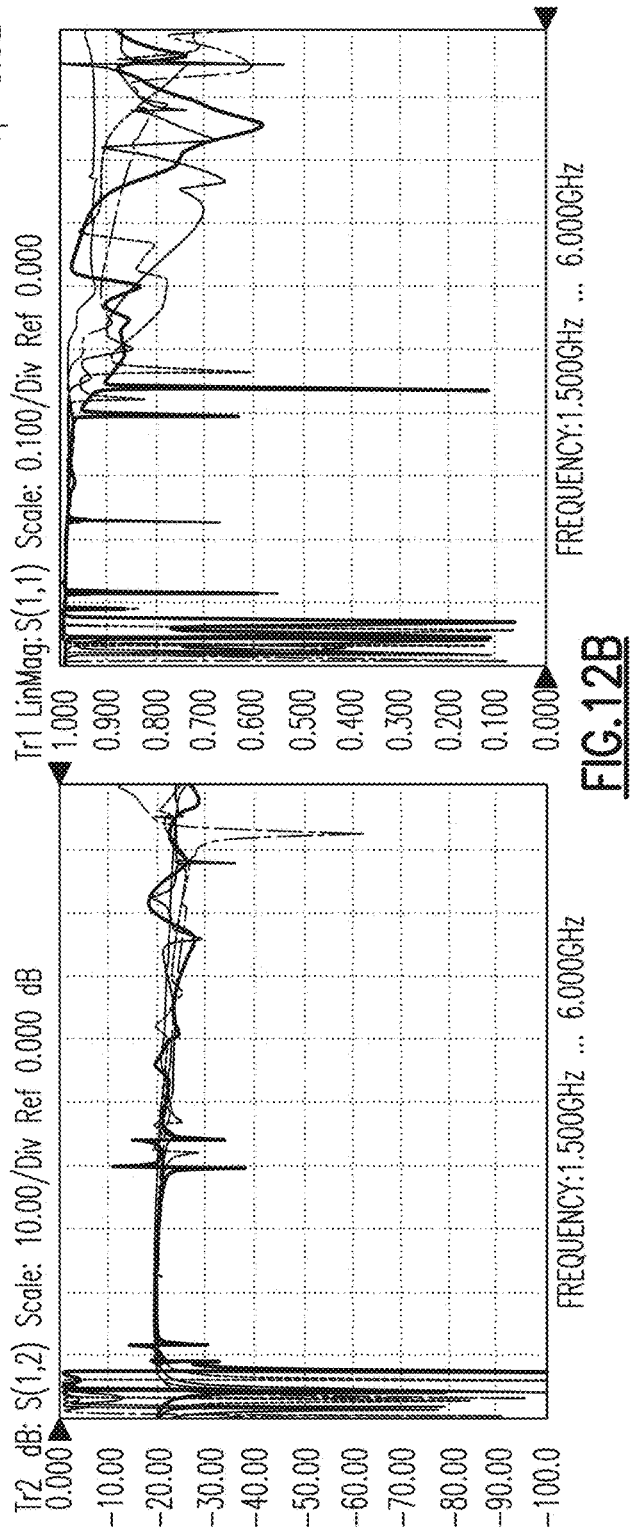
FIG. 12B illustrates graphs showing simulation results of isolation and reflection coefficient for the SAW resonator of FIG. 12A.

FIG. 12B illustrates graphs showing simulation results of isolation s12 on the left and reflection coefficient s11 (Γ) on the right for the SAW resonator 51 of FIG. 12A. The simulation results are for five different thicknesses T1 of the piezoelectric layer 20. The simulations were performed with the thicknesses T1 of 0.1 L, 0.2 L, 0.3 L, 0.4 L, and 0.5 L. These simulations indicate that when the lower impedance layer 28 is sufficiently thick, Γ can be degraded.

Figure 13A:
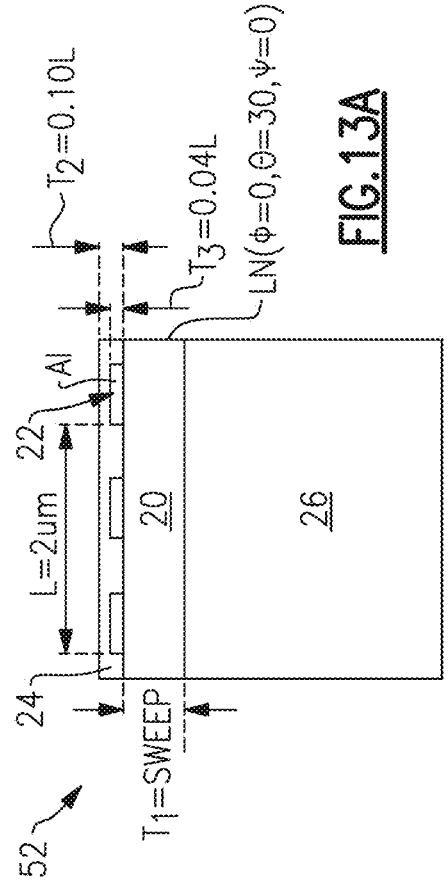
FIG. 13A illustrates a cross section of a SAW resonator according to another embodiment.

FIG. 13A illustrates a cross section of a SAW resonator 52 according to one embodiment. The SAW resonator 52 is like the SAW resonator 2 illustrated in FIG. 2A. The SAW resonator 52 can have a pitch L of 2 μm. The piezoelectric layer 20 of the SAW resonator 52 illustrated in FIG. 13A is a lithium niobate (LN) layer with a cut angle of 120°. The IDT electrodes 22 of the SAW resonator 52 are aluminum (Al) electrodes with a thickness T3 of 0.04 L. The temperature compensating layer 24 is a silicon dioxide (SiO$_2$) layer with a thickness T2 of 0.1 L. The high impedance layer 26 of the SAW resonator 6 is a silicon (Si) layer.

Figure 13B:
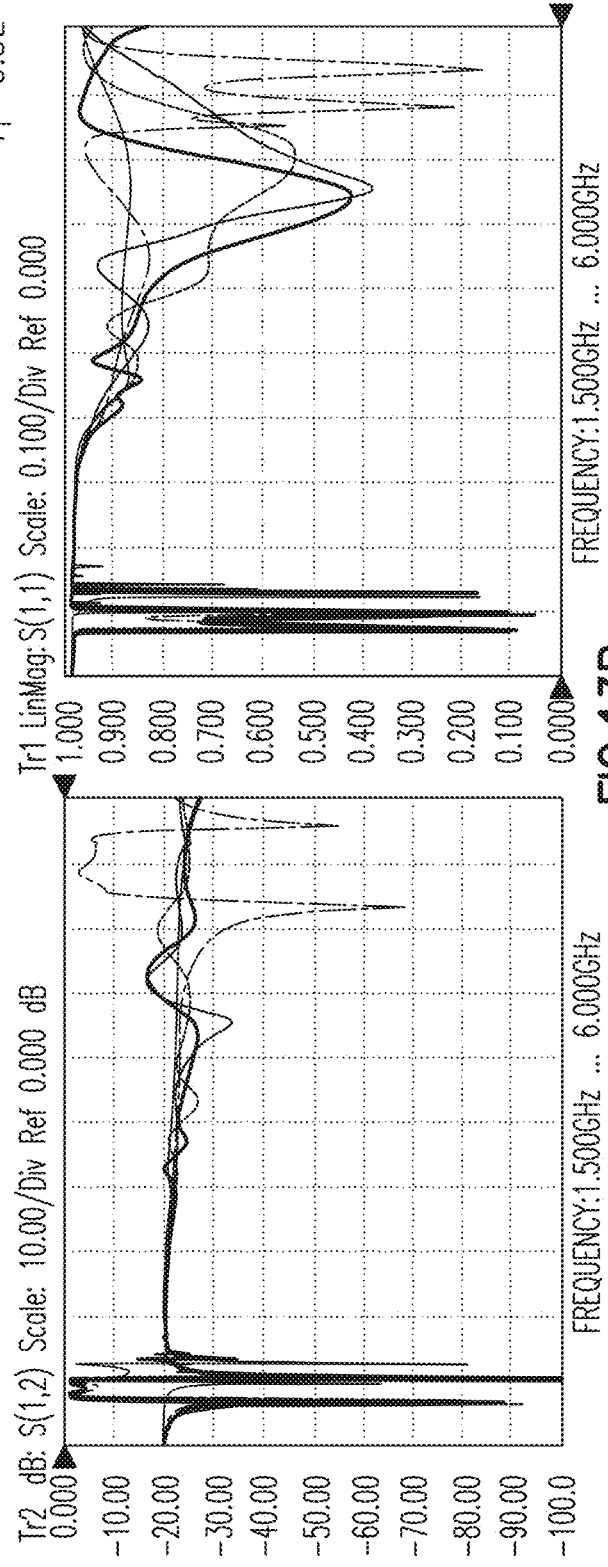
FIG. 13B illustrates graphs showing simulation results of isolation and reflection coefficient for the SAW resonator of FIG. 13A.

FIG. 13B illustrates graphs showing simulation results of isolation s12 on the left and reflection coefficient s11 (Γ) on the right for the SAW resonator 52 of FIG. 13A. The simulation results are for five different thicknesses T1 of the piezoelectric layer 20. The simulations were performed with the thicknesses T1 of 0.1 L, 0.2 L, 0.3 L, 0.4 L, and 0.5 L.

Figure 14A:
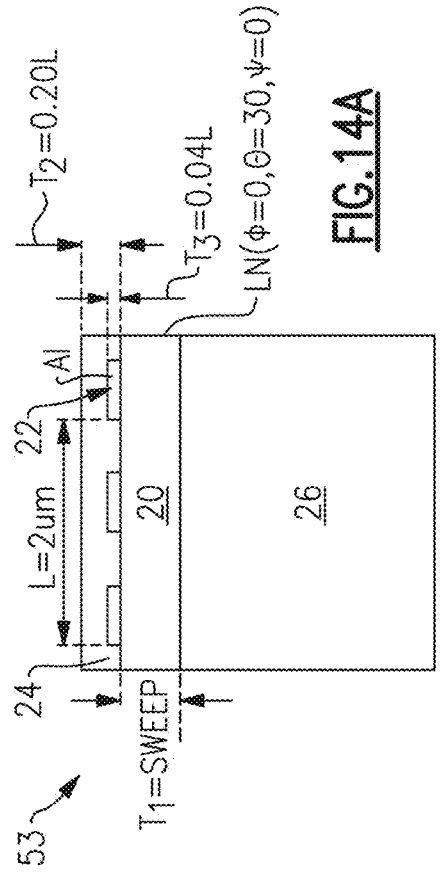
FIG. 14A illustrates a cross section of a SAW resonator according to another embodiment.

FIG. 14A illustrates a cross section of SAW resonator 53 according to one embodiment. The SAW resonator 53 is like the SAW resonator 52 illustrated in FIG. 13A except that the temperature compensating layer 24 of the SAW resonator 53 illustrated in FIG. 14A has a thickness T5 of 0.2 L.

Figure 14B:
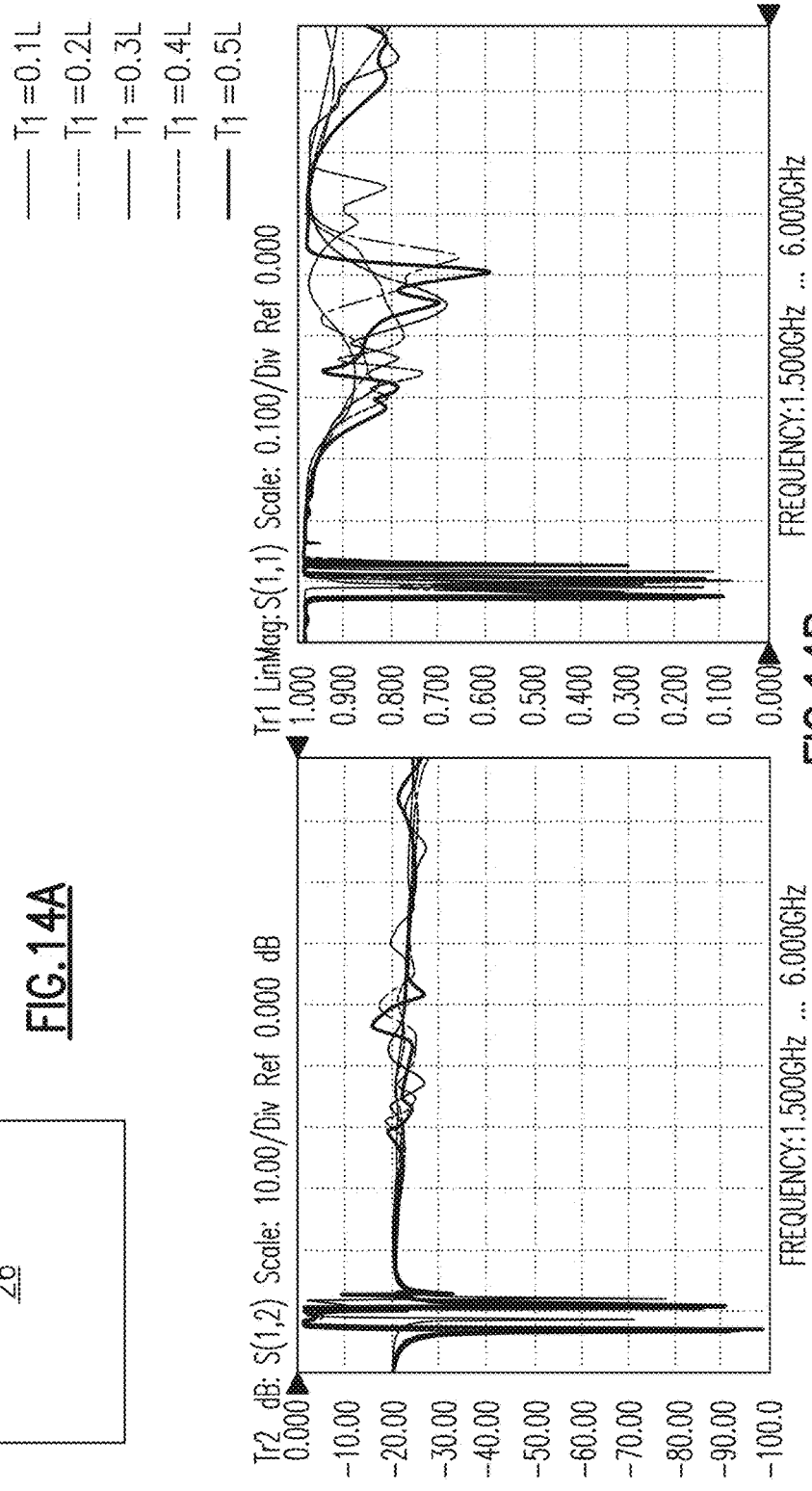
FIG. 14B illustrates graphs showing simulation results of isolation and reflection coefficient for the SAW resonator of FIG. 14A.

FIG. 14B illustrates graphs showing simulation results of isolation s12 on the left and reflection coefficient s11 (Γ) on the right for the SAW resonator 53 of FIG. 14A. The simulation results are for five different thicknesses T1 of the piezoelectric layer 20. The simulations were performed with the thicknesses T1 of 0.1 L, 0.2 L, 0.3 L, 0.4 L, and 0.5 L.

Figure 15A:
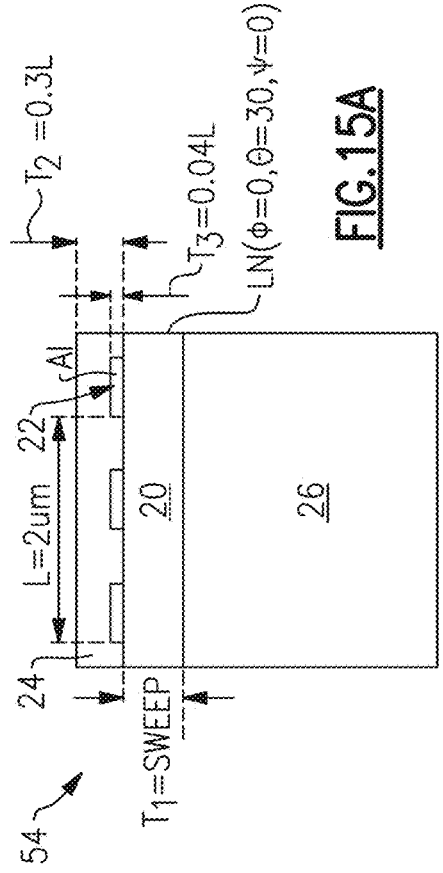
FIG. 15A illustrates a cross section of a SAW resonator according to another embodiment.

FIG. 15A illustrates a cross section of a SAW resonator 54 according to one embodiment. The SAW resonator 54 is like the SAW resonator 52 illustrated in FIG. 13A except that the temperature compensating layer 24 of the SAW resonator 54 illustrated in FIG. 15A has a thickness T5 of 0.3 L.

Figure 15B:
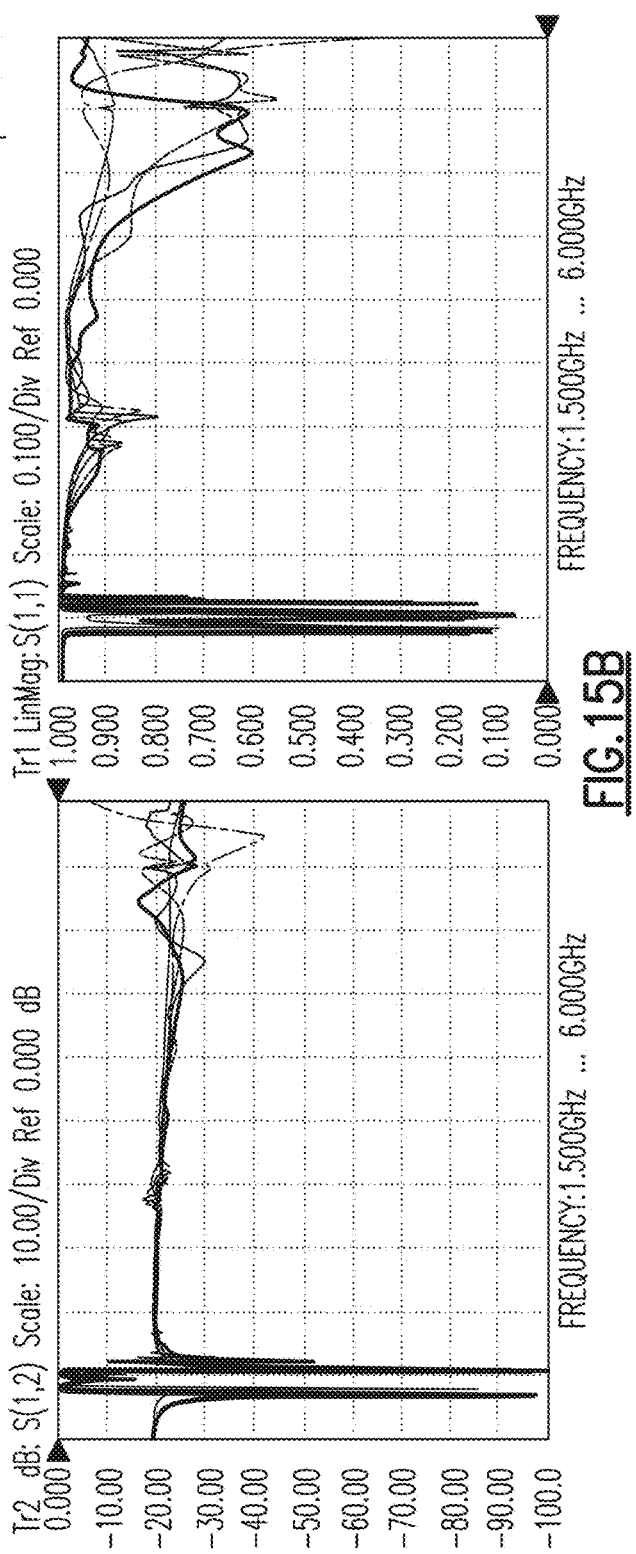
FIG. 15B illustrates graphs showing simulation results of isolation and reflection coefficient for the SAW resonator of FIG. 15A.

FIG. 15B illustrates graphs showing simulation results of isolation s12 on the left and reflection coefficient s11 (Γ) on the right for the SAW resonator 54 of FIG. 15A. The simulation results are for five different thicknesses T1 of the piezoelectric layer 20. The simulations were performed with the thicknesses T1 of 0.1 L, 0.2 L, 0.3 L, 0.4 L, and 0.5 L.

Figure 16A:
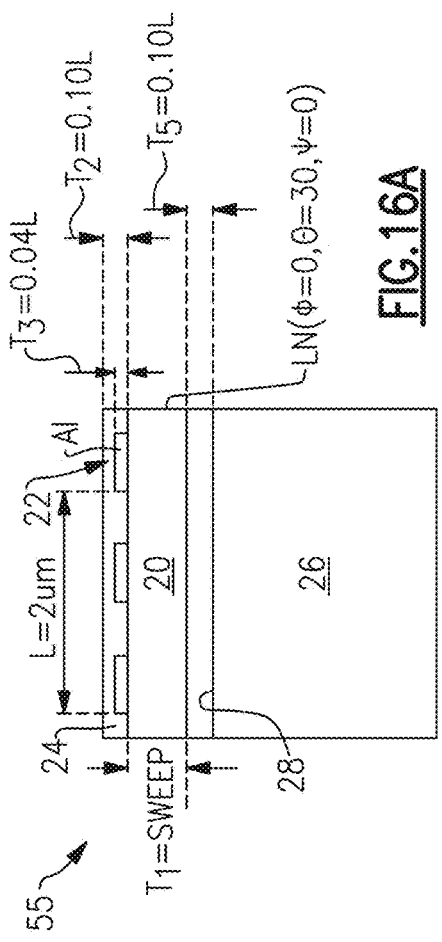
FIG. 16A illustrates a cross section of a SAW resonator according to another embodiment.

FIG. 16A illustrates a cross section of a SAW resonator 55 according to one embodiment. The SAW resonator 55 is like the SAW resonator 5 illustrated in FIG. 6, except that the SAW resonator 55 has a single layer IDT electrodes 22 instead of the multi-layer IDT electrodes 22' illustrated in FIG. 6.

Figure 16B:
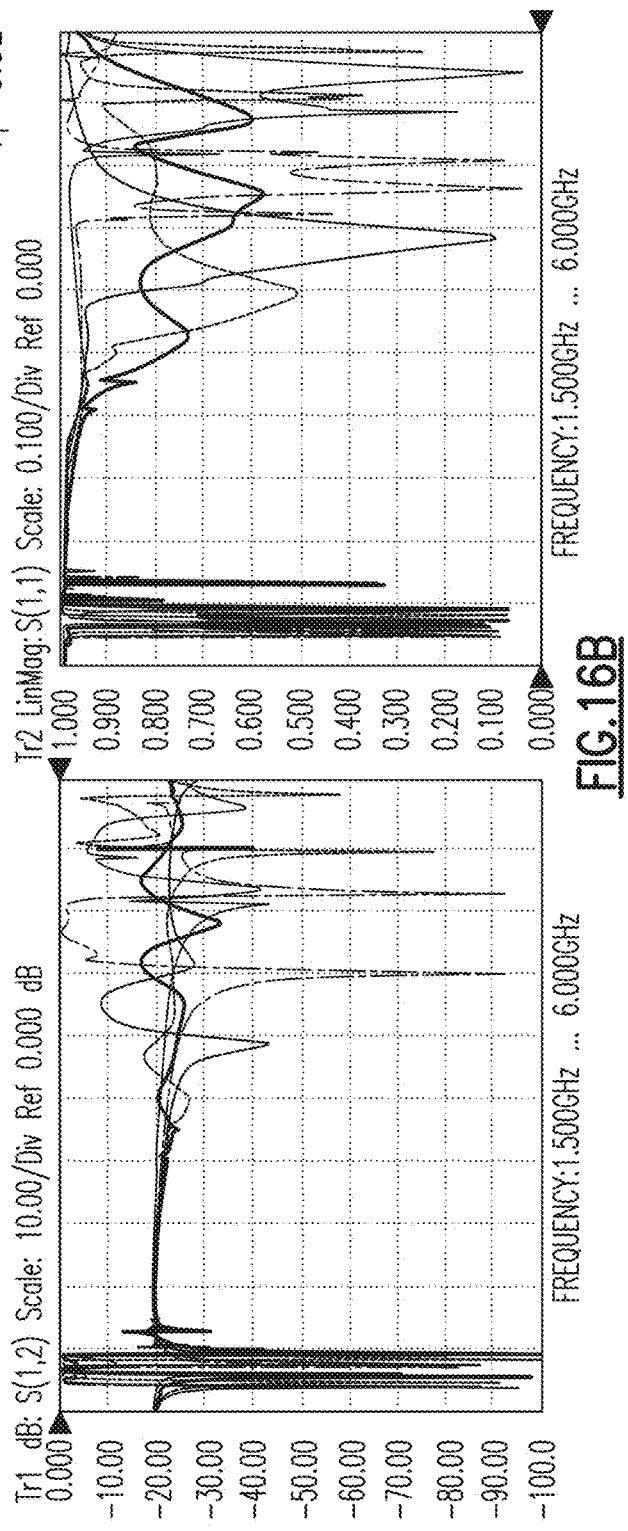
FIG. 16B illustrates graphs showing simulation results of isolation and reflection coefficient for the SAW resonator of FIG. 16A.

The SAW resonator 55 has a pitch L of 2 μm for the simulation corresponding to FIG. 16B. The piezoelectric layer 20 of the SAW resonator 55 illustrated in FIG. 16A is a lithium niobate (LN) layer with a cut angle of 120°. The IDT electrodes 22 of the SAW resonator 6 are aluminum (Al) electrodes with a thickness T3 of 0.04 L for the simulation corresponding to FIG. 16B. The temperature compensating layer 24 is a silicon dioxide (SiO$_2$) layer with a thickness T2 of 0.1 L. The high impedance layer 26 of the SAW resonator 55 is a silicon (Si) layer. The low impedance layer 28 of the SAW resonator 55 is a silicon dioxide (SiO$_2$) layer with a thickness T5 of 0.1 L.

FIG. 16B illustrates graphs showing simulation results of isolation s12 on the left and reflection coefficient s11 (Γ) on the right for the SAW resonator 55 of FIG. 16A. The simulation results are for five different thicknesses T1 of the piezoelectric layer 20. The simulations were performed with the thicknesses T1 of 0.1 L, 0.2 L, 0.3 L, 0.4 L, and 0.5 L.

When Al IDT electrodes are used as IDT electrodes 22, an open grating may be outside of a short grating. Such stopband performance may be undesirable. On the other hand, when IDT electrodes of a material that has a higher density than Al (e.g., molybdenum (Mo), tungsten (W), etc.) are used, the stopband performance may be improved. When the temperature compensating layer 24 is a silicon dioxide (SiO$_2$) layer and has a thickness T2 that is larger than 0.15 L, and Mo IDT electrodes are used, majority of the open grating can be within the short grating, which may indicate that the stopband performance is improved relative to the resonator with Al electrodes. Similarly, when the temperature compensating layer 24 is a silicon dioxide (SiO$_2$) layer and has a thickness T2 that is larger than 0.1 L, and W IDT electrodes are used, majority of the open grating can be within the short grating, which may indicate that the stopband performance is improved relative to the resonator with Al electrodes.

Figure 17A:
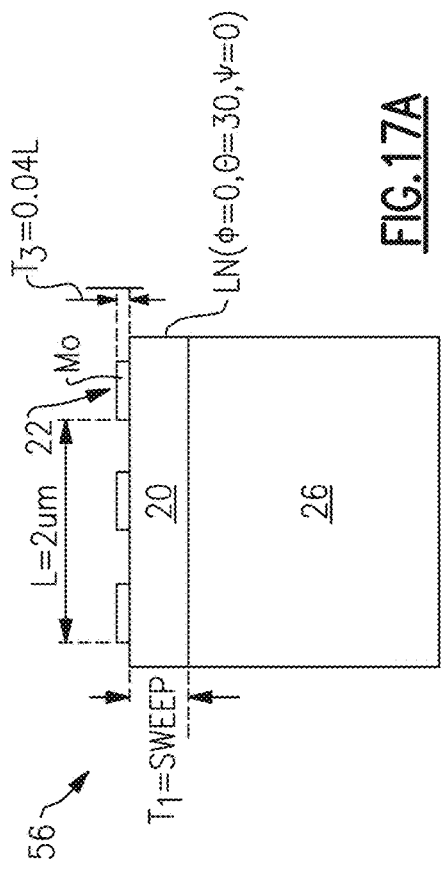
FIG. 17A illustrates a cross section of a SAW resonator.

FIG. 17A illustrates a cross section of a SAW resonator 56. The SAW resonator 56 is like the SAW resonator 6 illustrated in FIG. 8A except that the IDT electrodes 22 of the SAW resonator 56 illustrated in FIG. 17A are molybdenum (Mo) IDT electrodes with a thickness T3 of 0.4 L.

Figure 17B:
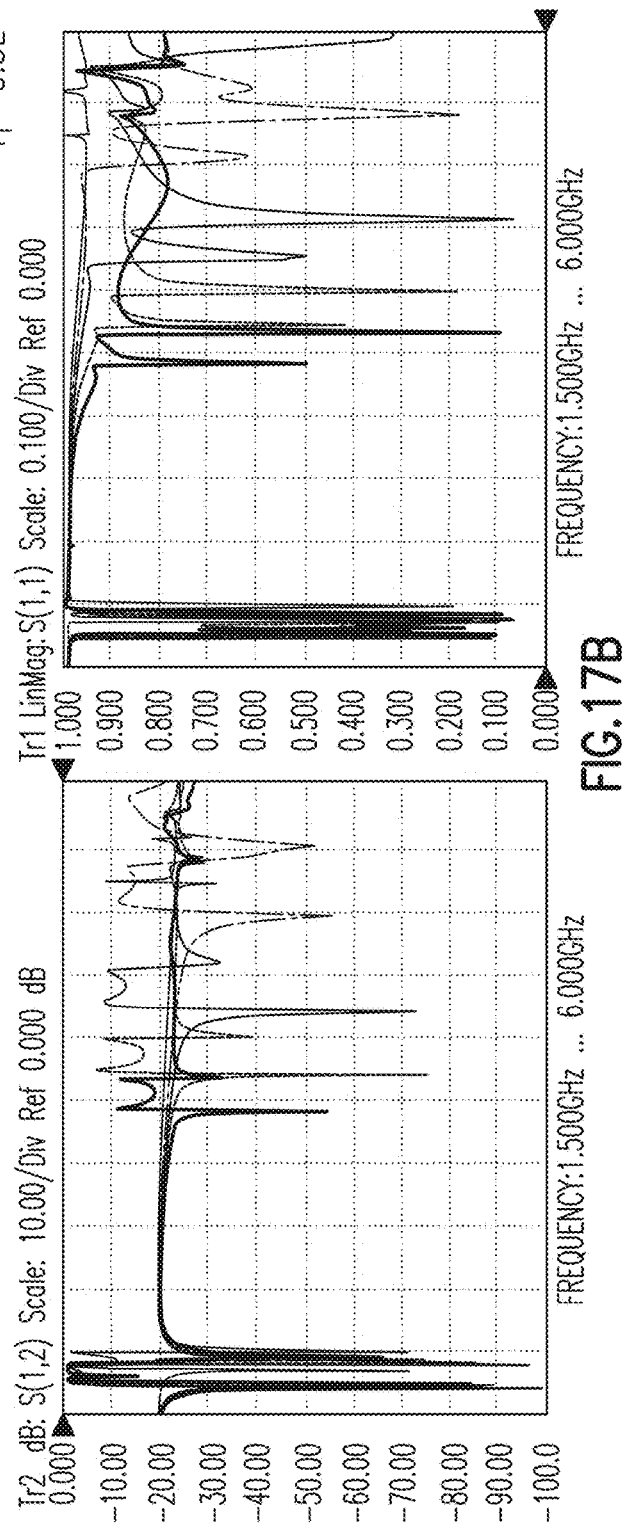
FIG. 17B illustrates graphs showing simulation results of isolation and reflection coefficient for the SAW resonator of FIG. 17A.

FIG. 17B illustrates graphs showing simulation results of isolation s12 on the left and reflection coefficient s11 (Γ) on the right for the SAW resonator 56 of FIG. 17A. The simulation results are for five different thicknesses T1 of the piezoelectric layer 20. The simulations were performed with the thicknesses T1 of 0.1 L, 0.2 L, 0.3 L, 0.4 L, and 0.5 L.

Figure 18A:
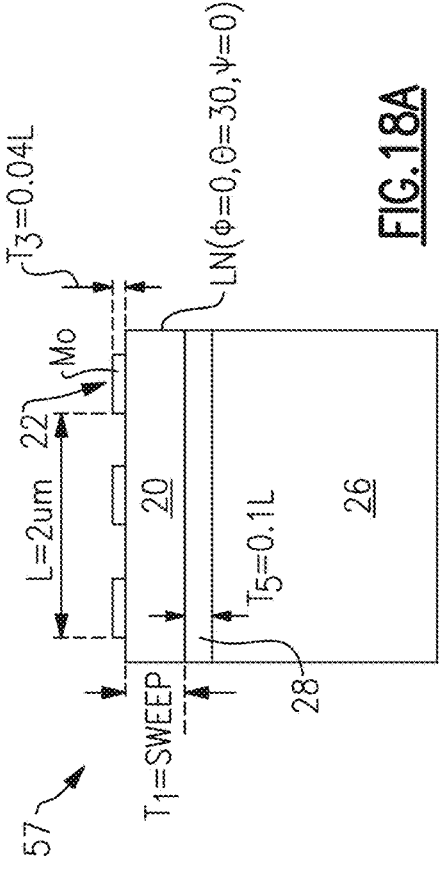
FIG. 18A illustrates a cross section of a SAW resonator according to another embodiment.

FIG. 18A illustrates a cross section of a SAW resonator 57 according to one embodiment. The SAW resonator 57 is like the SAW resonator 56 illustrated in FIG. 17A except that the SAW resonator 57 also includes a low impedance layer 28. The low impedance layer 28 of the SAW resonator 57 illustrated in FIG. 18A is a silicon dioxide (SiO$_2$) layer with a thickness T5 of 0.1 L for the simulation corresponding to FIG. 18B.

Figure 18B:
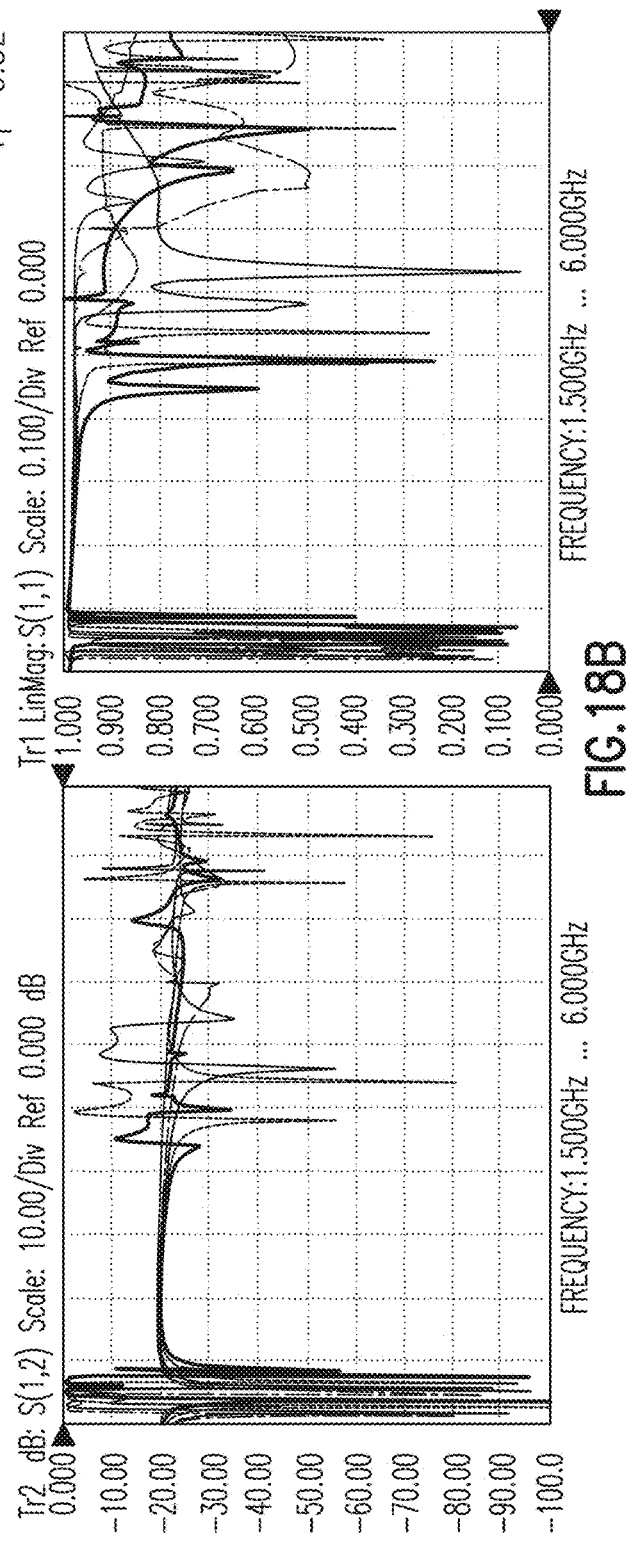
FIG. 18B illustrates graphs showing simulation results of isolation and reflection coefficient for the SAW resonator of FIG. 18A.

FIG. 18B illustrates graphs showing simulation results of isolation s12 on the left and reflection coefficient s11 (Γ) on the right for the SAW resonator 57 of FIG. 18A. The simulation results are for five different thicknesses T1 of the piezoelectric layer 20. The simulations were performed with the thicknesses T1 of 0.1 L, 0.2 L, 0.3 L, 0.4 L, and 0.5 L. As compared to the simulation results of the SAW resonator 56, the Γ is improved in the simulation results of the SAW resonator 57. Accordingly, the low impedance layer 28 can contribute to improved Γ in the SAW resonator 57.

Figure 19A:
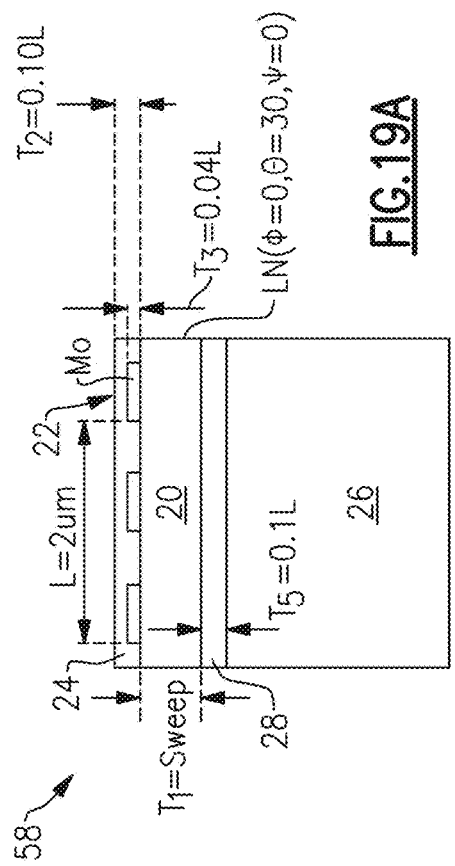
FIG. 19A illustrates a cross section of a SAW resonator according to another embodiment.

FIG. 19A illustrates a cross section of a SAW resonator 58 according to one embodiment. The SAW resonator 58 is like the SAW resonator 57 illustrated in FIG. 18A except that the SAW resonator 58 illustrated in FIG. 19A also includes a temperature compensating layer 24. The temperature compensating layer 24 of the SAW resonator 58 is a silicon dioxide (SiO$_2$) layer with a thickness T2 of 0.1 L for the simulation corresponding to FIG. 19B.

Figure 19B:
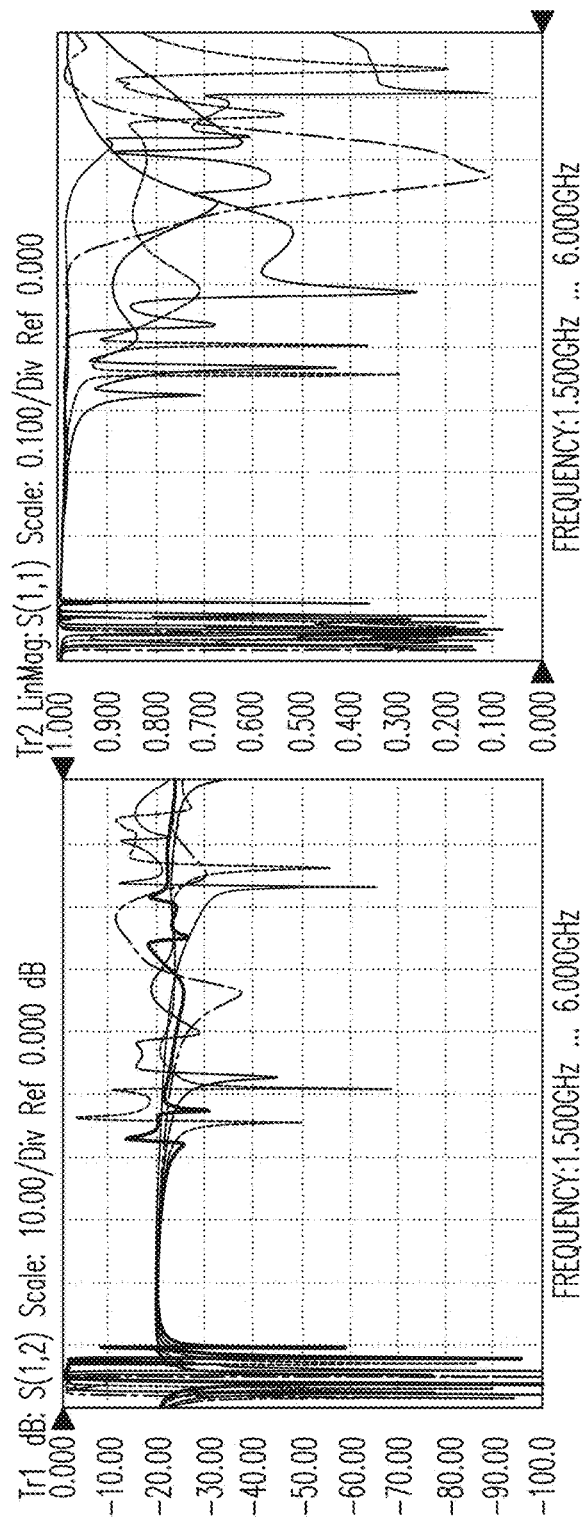
FIG. 19B illustrates graphs showing simulation results of isolation and reflection coefficient for the SAW resonator of FIG. 19A.

FIG. 19B illustrates graphs showing simulation results of isolation s12 on the left and reflection coefficient s11 (Γ) on the right for the SAW resonator 58 of FIG. 19A. The simulation results are for five different thicknesses T1 of the piezoelectric layer 20. The simulations were performed with the thicknesses T1 of 0.1 L, 0.2 L, 0.3 L, 0.4 L, and 0.5 L. As compared to the simulation results of the SAW resonator 56, the Γ is improved in the simulation results of the SAW resonator 58.

Figure 20A:
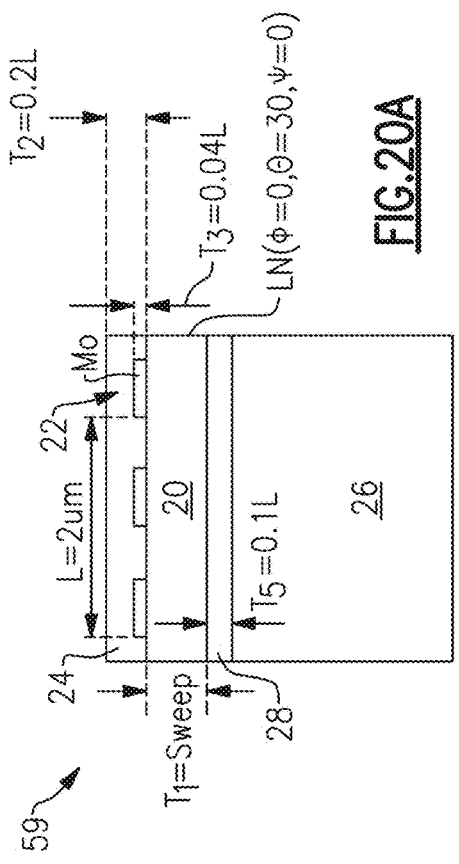
FIG. 20A illustrates a cross section of a SAW resonator according to another embodiment.

FIG. 20A illustrates a cross section of a SAW resonator 59 according to one embodiment. The SAW resonator 59 is like the SAW resonator 58 illustrated in FIG. 19A except that the temperature compensating layer 24 of the SAW resonator 59 illustrated in FIG. 20A has a thickness T5 of 0.2 L.

Figure 20B:
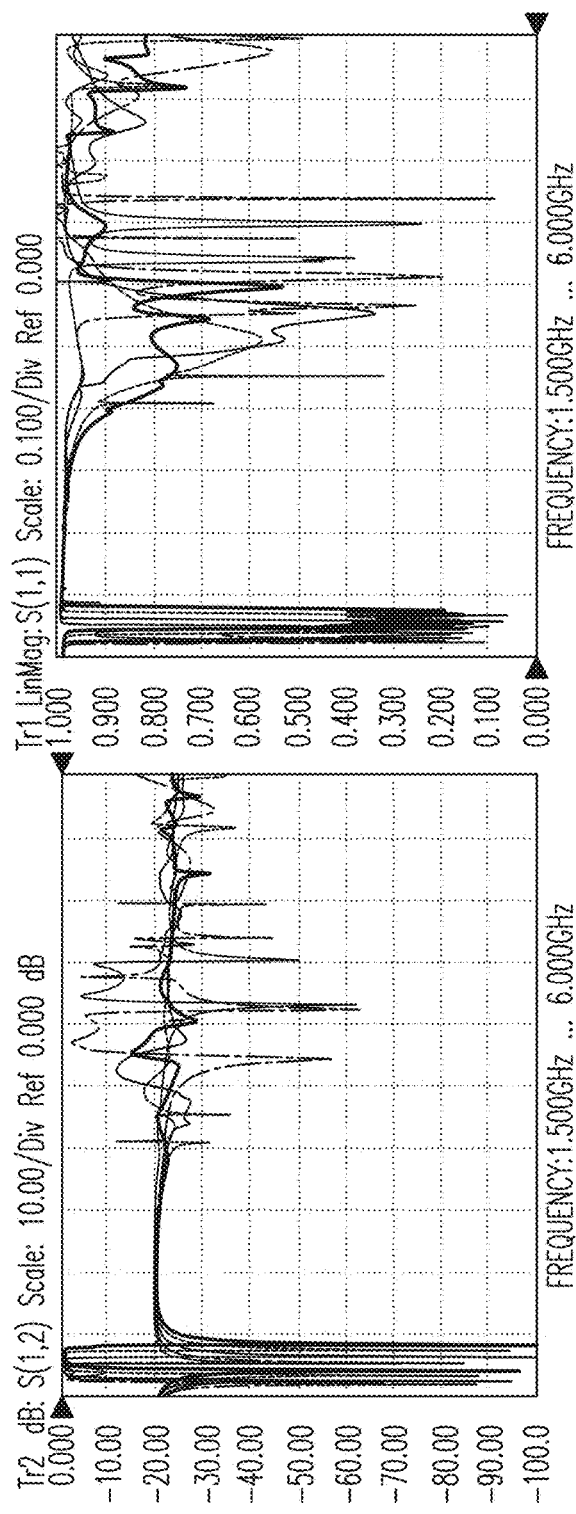
FIG. 20B illustrates graphs showing simulation results of isolation and reflection coefficient for the SAW resonator of FIG. 20A.

FIG. 20B illustrates graphs showing simulation results of isolation s12 on the left and reflection coefficient s11 (Γ) on the right for the SAW resonator 59 of FIG. 14A. The simulation results are for five different thicknesses T1 of the piezoelectric layer 20. The simulations were performed with the thicknesses T1 of 0.1 L, 0.2 L, 0.3 L, 0.4 L, and 0.5 L. As compared to the simulation results of the SAW resonator 56, the Γ is improved in the simulation results of the SAW resonator 59.

Figure 21A:
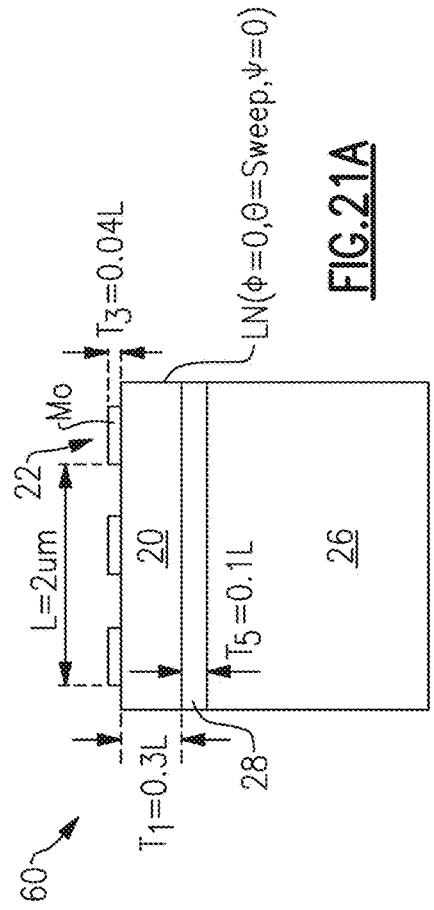
FIG. 21A illustrates a cross section of a SAW resonator according to another embodiment.

FIG. 21A illustrates a cross section of a SAW resonator 60 according to one embodiment. The SAW resonator 60 is like the SAW resonator 57 illustrated in FIG. 18A except that the piezoelectric layer 20 of the SAW resonator 60 illustrated in FIG. 20A has a thickness T1 of 0.3 L.

Figure 21B:
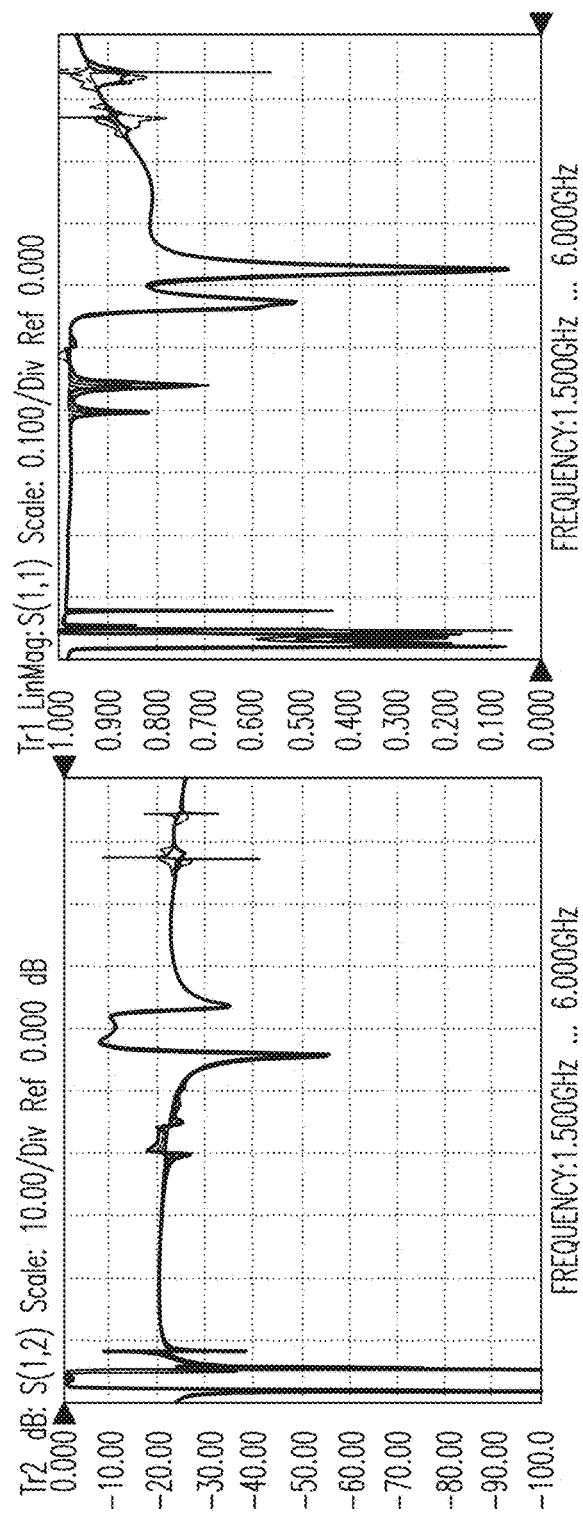
FIG. 21B illustrates graphs showing simulation results of isolation and reflection coefficient on the right for the SAW resonator of FIG. 21A.

FIG. 21B illustrates graphs showing simulation results of isolation s12 on the left and reflection coefficient s11 (Γ) on the right for the SAW resonator 60 of FIG. 21A. The simulation results are for five different cut angles of the piezoelectric layer 20. The simulations were performed with the cut angles of 120°, 122°, 124°, 126°, and 128°. The graph of reflection coefficient of FIG. 21B indicates that spikes are affected by the cut angle of the piezoelectric layer 20. FIG. 21B indicates that the cut angle of the piezoelectric layer 20 can affect gamma.

FIG. 22A illustrates a cross section of a SAW resonator 61 according to one embodiment. The SAW resonator 61 is like the SAW resonator 5 illustrated in FIG. 6, except that the SAW resonator 55 has a single layer IDT electrodes 22 instead of the multi-layer IDT electrodes 22' illustrated in FIG. 6 and various features of the layers (e.g., cut angle, material and/or thickness) are indicated in FIG. 16A.

The SAW resonator 61 is illustrated with a pitch L of 2 μm. The piezoelectric layer 20 of the SAW resonator 61 illustrated in FIG. 22A is a lithium niobate (LN) layer. The piezoelectric layer 20 of the SAW resonator 61 has a thickness T1 of 0.3 L. The IDT electrodes 22 of the SAW resonator 61 have a thickness T3 of 0.04 L. The IDT electrodes 22 of the SAW resonator 61 can be tungsten or molybdenum. The temperature compensating layer 24 of the SAW resonator 61 is a silicon dioxide (SiO$_2$) layer with a thickness T2 of 0.2 L. The high impedance layer 26 of the SAW resonator 61 is a silicon (Si) layer. The low impedance layer 28 of the SAW resonator 61 is a silicon dioxide (SiO$_2$) layer with a thickness T5 of 0.1 L.

FIG. 22B illustrates a cross section of a SAW resonator 62. The illustrated SAW resonator 62 is like the SAW resonator 1 illustrated in FIG. 1 with a single layer IDT electrode. The SAW resonator 62 includes an LN layer 10', IDT electrodes 12' over the LN layer 10', and an SiO$_2$ layer 14' over the IDT electrodes 12'. The LN layer 10' has a cut angle of 126°. The pitch L of the SAW resonator 62 is 2 μm. A thickness of the SiO$_2$ layer 14' of the SAW resonator 62 is 0.2 L. The IDT electrodes 12' of the SAW resonator 62 are molybdenum (Mo) IDT electrodes. The IDT electrodes 12' a thickness of 0.04 L.

FIG. 22C illustrates graphs showing simulation results of isolation s12 on the left and reflection coefficient s11 (Γ) on the right for the SAW resonators 61 and 62 of FIGS. 22A and 22B, respectively. The curves for the SAW resonator 61 have lithium niobate piezoelectric layers with cut angles of 122° and 124°. The simulations were performed with tungsten (W) IDT electrodes and molybdenum (Mo) IDT electrodes for the SAW resonator 61. As compared to the simulation result of the SAW resonator 62, the Γ is improved in the simulation results of the SAW resonator 61.

Figure 23A:
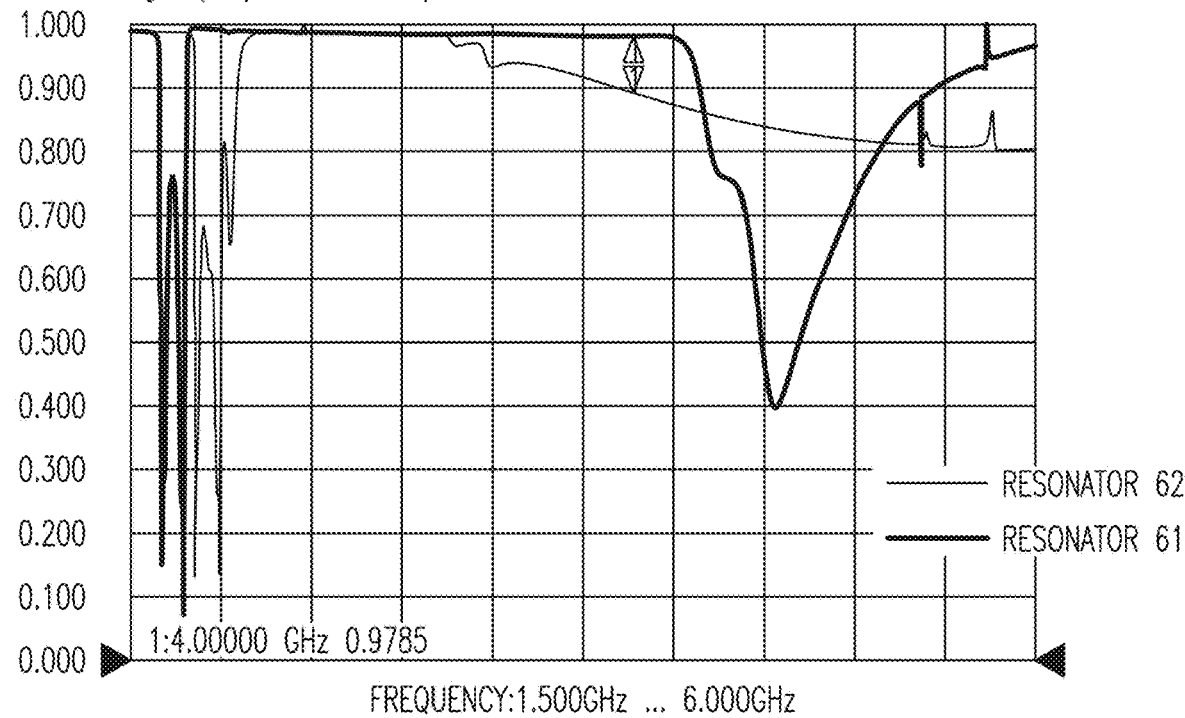
FIG. 23A illustrates graphs showing simulation results of isolation and reflection coefficient for the SAW resonators of FIGS. 22A and 22B with a different simulation set up than for the simulations corresponding to graphs of FIG. 22C.

FIG. 23A illustrates graphs showing simulation results of isolation s12 on the left and reflection coefficient s11 (Γ) on the right for the SAW resonators 61 and 62 of FIGS. 22A and 22B respectively. The simulations were performed with molybdenum (Mo) IDT electrodes and LN layers with a cut angle of 120° for the SAW resonator 61 and the SAW resonator 62. The differences in the graphs of FIGS. 22C and 23A can be due to differences in cut angle.

Figures 23B, 23C:
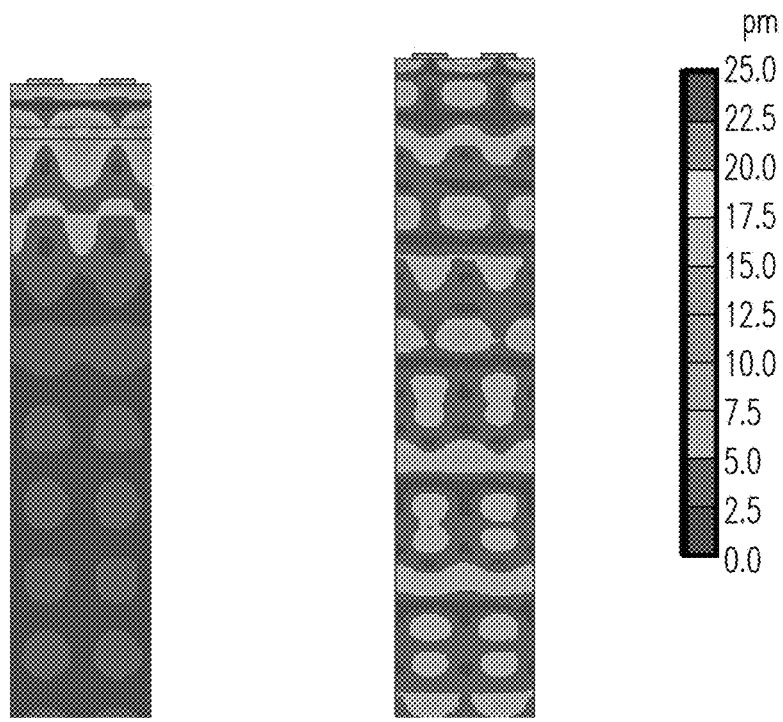
FIG. 23B illustrates transmission leakage of the SAW resonator of FIG. 22A at a frequency of 4 GHz.
FIG. 23C illustrates transmission leakage of the SAW resonator of FIG. 22B at a frequency of 4 GHz.

FIG. 23B illustrates transmission leakage of the SAW resonator 61 illustrated in FIG. 22A at a frequency of 4 GHz. FIG. 23C illustrates transmission leakage of the SAW resonator 62 of FIG. 22B at a frequency of 4 GHz. The acoustic leakage is reduced for the SAW resonator 61 as compared to the acoustic leakage of the SAW resonator 62.

Figure 24:
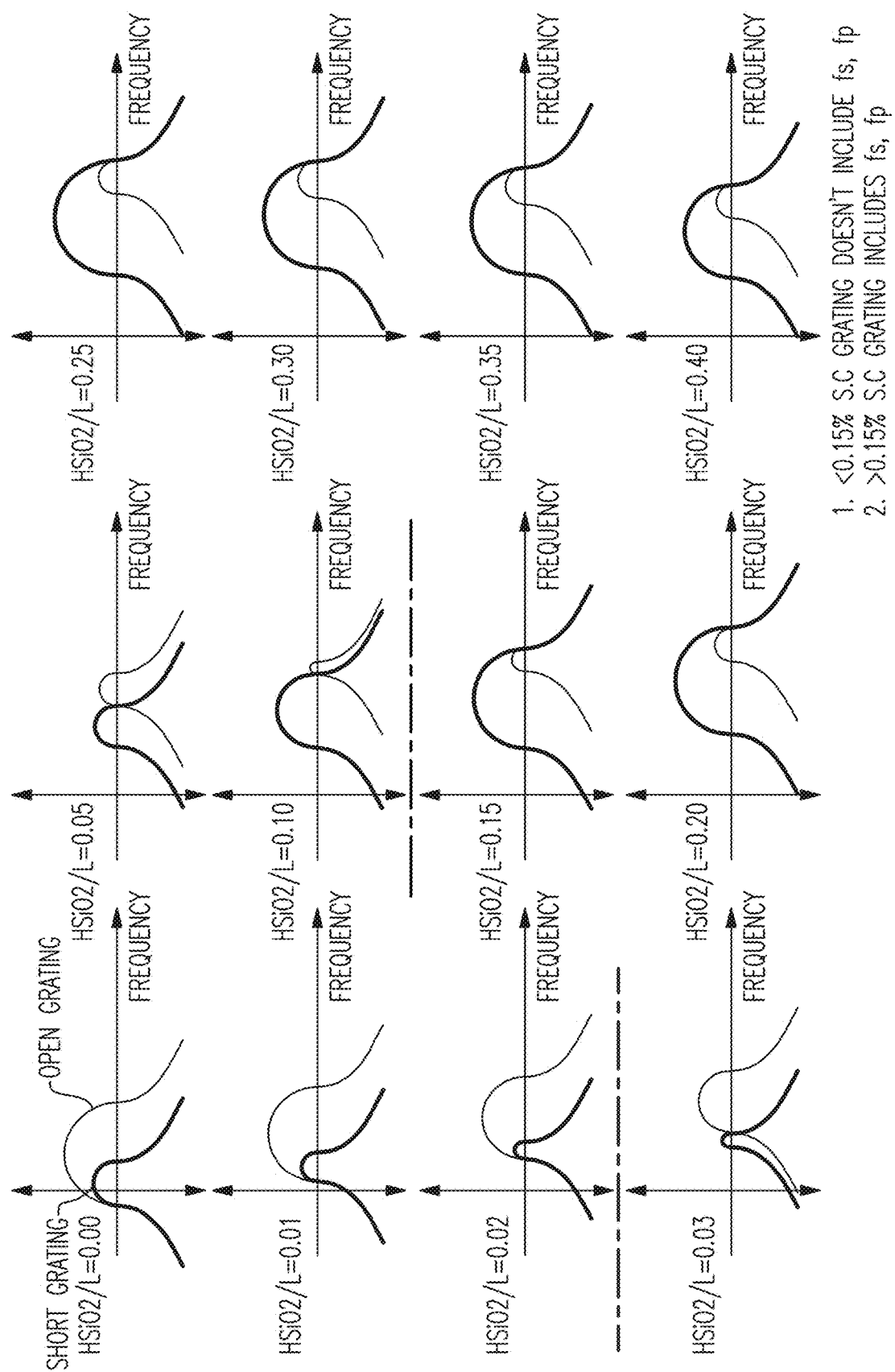
FIG. 24 illustrates graphs showing simulated dispersion curves of a SAW resonator having various thicknesses of silicon dioxide ($SiO_2$) layer over a molybdenum (Mo) interdigital transducer (IDT) electrode.

FIG. 24 illustrates graphs showing simulated dispersion curves of a SAW resonator having various thicknesses of silicon dioxide (SiO$_2$) layer over a molybdenum (Mo) IDT electrode. The simulations were performed with the SiO$_2$ layer having thicknesses of 0 (no SiO$_2$ layer over the IDT electrode), 0.01 L, 0.02 L, 0.03 L, 0.05 L, 0.1 L, 0.15 L, 0.2 L, 0.25 L, 0.3 L, 0.35 L, and 0.4 L. Each of the graphs show a short grating dispersion curve and an open grating dispersion curve. The x-axis shows frequency and the y-axis shows wave number. These graphs indicate that, when the thickness of the SiO$_2$ layer is more than about 0.15 L, the dispersion is better than when the thickness of the SiO$_2$ layer is less than about 0.15 L.

From these simulation results of the SAW resonators according to various embodiments, desirable resonator structures can be determined for particular operations. For example, the determination of a thickness T1 of the piezoelectric layer 20, a thickness T2 of the temperature compensating layer 24, a thickness T4 of the high impedance layer 26, and/or a thickness T5 of the low impedance layer 28 can be based at least in part on the simulated reflection coefficient (Γ). For example, a material for the piezoelectric layer 20, a cut angle of the piezoelectric layer 20, and/or a material for the IDT electrodes 22, 22' can be determined based at least in part on the simulated reflection coefficient (Γ). The simulated reflection coefficient (Γ) of the SAW resonators in various embodiments can be analyzed to determine a suitable structure of a SAW resonator for certain applications.

The simulation results indicate that the high impedance layer 26 and/or the low acoustic impedance layer 28 affect the wide range gamma. Therefore, a selection of suitable thicknesses and/or materials for the high impedance layer 26 and/or the low acoustic impedance layer 28 can improve the wide range gamma. For example, the simulation results indicate that using a silicon dioxide (SiO$_2$) layer with a thickness in a range from 0.01 L to 0.3 L, such as a thickness of about 0.1 L, as the low acoustic impedance layer 28 can improve the wide range gamma.

The simulation results indicate that the temperature compensating layer 24 and/or the cut angle of the piezoelectric layer 20 affect the narrow range gamma. Therefore, a selection of suitable thicknesses or materials for the temperature compensating layer 24 and/or the piezoelectric layer 20 can improve the narrow range gamma. For example, the simulation results indicate that using a silicon dioxide ($SiO_2$) layer with a thickness greater than about 0.15 L as the temperature compensating layer 24 can improve the narrow range gamma. By using such $SiO_2$ layer as temperature compensating layer, a resonator can obtain reflection characteristics similar to a TC-SAW resonator.

The simulation results indicate that a lithium niobate (LN) layer with cut angle in a range from 118° to 138°, such as a cut angle of about 128°, can be a suitable piezoelectric layer to use in embodiments disclosed herein. The simulation results indicate that an LN layer with a thickness in a range from 0.1 L to 0.5 L, such as a thickness of about 0.3 L, can be a suitable piezoelectric layer to use in various embodiments disclosed herein. The simulation results indicate that the Mo IDT electrodes or the W IDT electrodes improve an electromechanical coupling coefficient $k^2$ relative to the Al IDT electrodes.

In some instances, a SAW resonator according to one embodiment can have, referring to reference numerals used in FIG. 6, a silicon (Si) layer (as the high impedance layer 26), a silicon dioxide ($SiO_2$) layer with a thickness of 0.1 L (as the low impedance layer 28) over the Si layer, a lithium noibate (LN) layer with a cut angle of 124° and a thickness of 0.3 L (as the piezoelectric layer 20) over the $SiO_2$ layer, an aluminum/molybdenum (Al/Mo) IDT electrodes with a Mo thickness of 0.04 L (as the IDT electrodes 22') over the LN layer, and another silicon dioxide ($SiO_2$) layer with a thickness of 0.2 L (as the temperature compensating layer 24) over the IDT electrodes. In some other instances, a SAW resonator according to one embodiment can have a silicon (Si) layer, a silicon dioxide ($SiO_2$) layer with a thickness of 0.1 L over the Si layer, a 120YX lithium noibate (LN) layer with a thickness of 0.3 L over the $SiO_2$ layer, and an aluminum/molybdenum (Al/Mo) IDT electrodes with a Mo thickness of 0.04 L over the LN layer. Such structure can be generally similar to the SAW resonator 57 illustrated in FIG. 18A. Such structure, unlike the IDT electrode 22 of the SAW resonator 57, has the Al layer over the Mo layer.

Any of the SAW resonators with the temperature compensating layer disclosed herein may also include a dispersion adjustment layer over the temperature compensating layer. The dispersion adjustment layer can have a trench, in some embodiments. In certain applications, the dispersion adjustment layer with the trench can suppress the transverse mode.

Figure 25C:
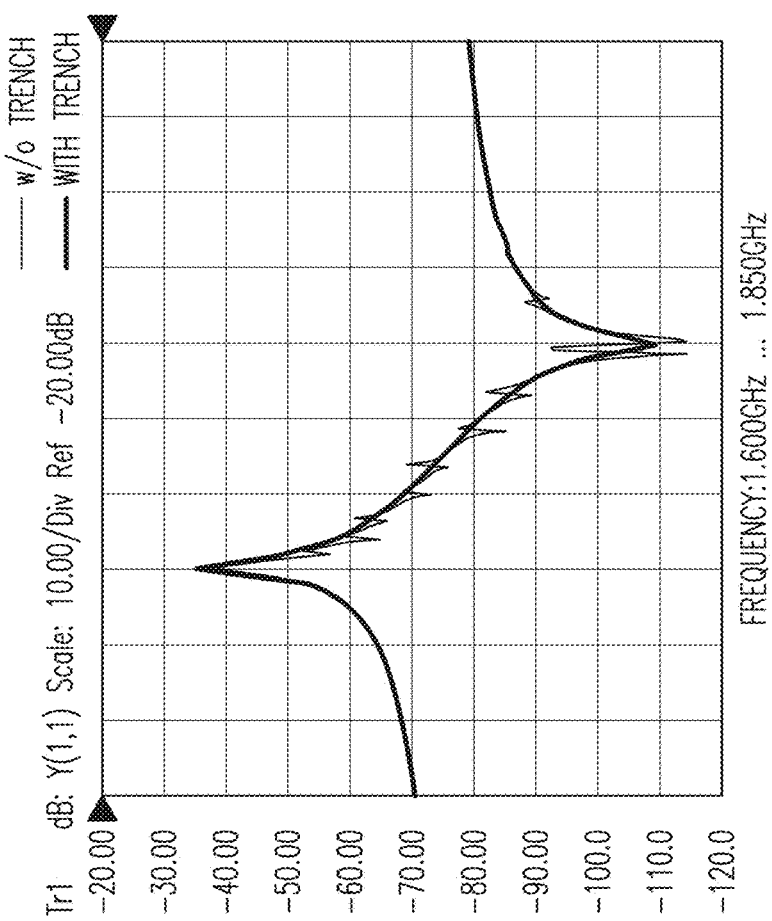
FIG. 25C is a graph showing simulation results of admittance of the SAW resonator of FIG. 25A and a similar resonator.
Figure 25A:
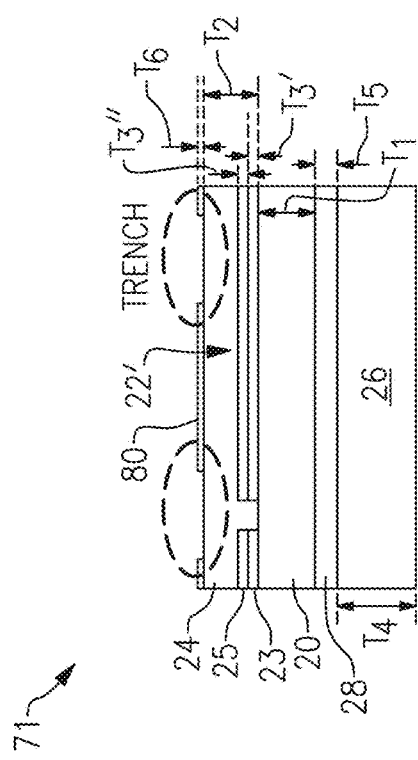
FIG. 25A illustrates a cross section of a surface acoustic wave resonator according to one embodiment.
Figure 25B:
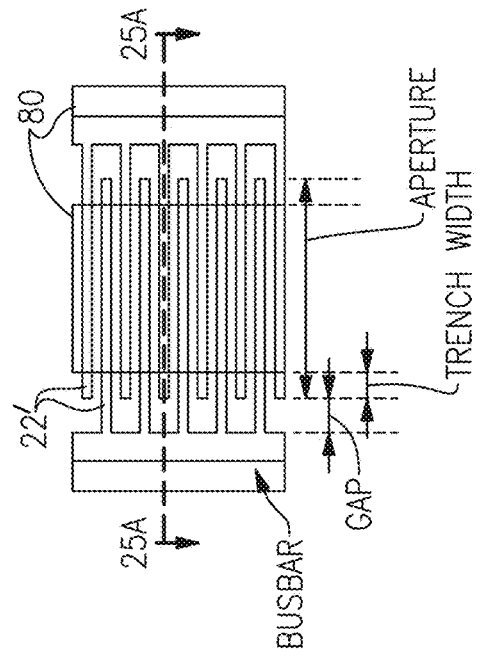
FIG. 25B is a top plan view of the surface acoustic wave resonator illustrated in FIG. 25A.

FIG. 25A illustrates a cross section of a surface acoustic wave resonator 71 according to one embodiment. The SAW resonator 71 is similar to the SAW resonator 5 illustrated in FIG. 6. FIG. 25B is a top plan view of the resonator 71 illustrated in FIG. 25A. Unless otherwise noted, the components of FIGS. 25A and 25B may be similar to or the same as like numbered components of FIG. 6. The SAW resonator 71 includes a piezoelectric layer 20, IDT electrodes 22' over the piezoelectric layer 20, a temperature compensating layer 24 over the IDT electrodes 22', and a high impedance layer 26 under the piezoelectric layer 20. The SAW resonator 71 also includes a low impedance layer 28 between the piezoelectric layer 20 and the high impedance layer 26, and a dispersion adjustment layer 80 over the temperature compensating layer 24.

The illustrated dispersion adjustment layer 80 is partially disposed over an upper surface of the temperature compensation layer 24 with trenches. However, the dispersion adjustment layer 80 can be disposed entirely over the upper surface of the temperature compensation layer 24 in some other instances. The dispersion adjustment layer 80 can cause a magnitude of the velocity in the underlying region of the SAW resonator 71 to be increased. The trench can reduce velocity in the underlying region of the SAW resonator 71 relative to regions covered by the dispersion adjustment layer 80 to thereby suppress transverse modes. The dispersion adjustment layer 80 can include a SiN layer. In certain applications, the dispersion adjustment layer 80 can include any suitable material to increase the magnitude of the velocity of the underlying region of a SAW resonator. According to some applications, the dispersion adjustment layer 80 can include SiN and another material. The dispersion adjustment layer 80 has a thickness T6. In some embodiments, the thickness T6 of the dispersion adjustment layer 80 can be in a range from 0.001 L to 0.05 L.

FIG. 25C is a graph showing simulation results of admittance of the SAW resonator 71 of FIG. 25A and a similar resonator without the trenches in the dispersion adjustment layer 80. In the simulation: a lithium niobate (LN) piezoelectric layer with a thickness T1 of 0.3 L was used as the piezoelectric layer 20; an Al/Mo IDT electrodes with a thickness T3' of the Mo layer of 0.04 L and a thickness T3" of the Al layer of 0.04 L was used as the IDT electrodes 22'; a silicon dioxide (Sift) layer with a thickness T2 of 0.2 L was used as the temperature compensating layer 24; a silicon (Si) layer was used as the high impedance layer 26; a silicon dioxide (Sift) layer with a thickness T5 of 0.1 L was used as the low impedance layer 28; and a silicon nitride (SiN) layer with a thickness T6 of 0.005 L was used as the dispersion adjustment layer 80.

The trenches in the dispersion adjustment layer 80 are formed over edges of IDT fingers. A gap between a bus bar to an edge of a finger of the IDT electrode 22' can be about 0.9 L. The gap can be in a range from 0.9 L to 2 L in some embodiments. A trench width between the edge of the finger of the IDT electrode to an edge of a middle portion of the dispersion adjustment layer 80 can be about 1 L. The trench width can be in a range from 0.5 L to 1.5 L, in certain embodiments.

The graph shown in FIG. 25B indicates that the transverse mode is suppressed for the SAW resonator that includes the trench in the dispersion adjustment layer 80, as compared to the similar resonator that does not include the trench in the dispersion adjustment layer 80.

Figure 26:
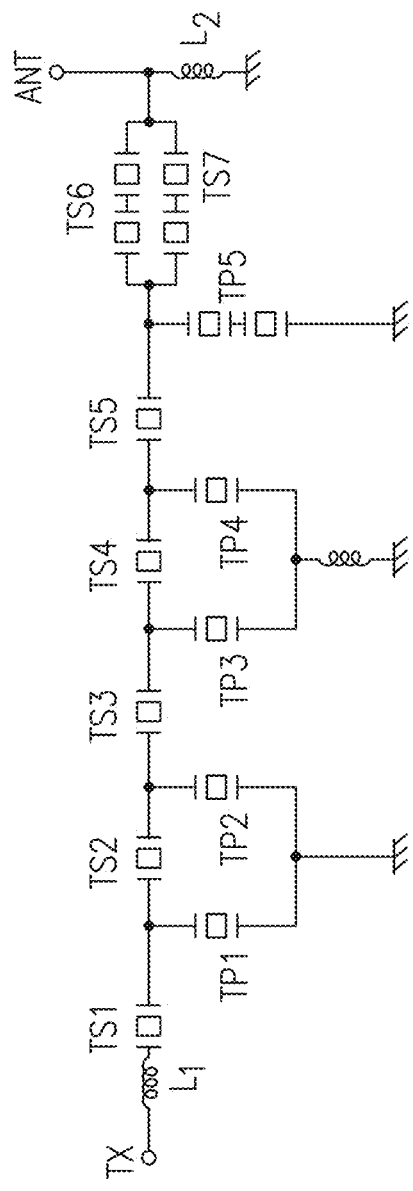
FIG. 26 is a schematic diagram of a transmit filter that includes a surface acoustic wave resonator according to an embodiment.

FIG. 26 is a schematic diagram of an example transmit filter 85 that includes surface acoustic wave resonators according to an embodiment. The transmit filter 85 can be a band pass filter. The illustrated transmit filter 85 is arranged to filter a radio frequency signal received at a transmit port TX and provide a filtered output signal to an antenna port ANT. Some or all of the SAW resonators TS1 to TS7 and/or TP1 to TP5 can be a SAW resonators in accordance with any suitable principles and advantages disclosed herein. For instance, one or more of the SAW resonators of the transmit filter 85 can be a surface acoustic wave resonator 2 of FIG. 2 or a surface acoustic wave resonator 5 of FIG. 6. Alternatively or additionally, one or more of the SAW resonators of the transmit filter 85 can be any surface acoustic wave resonator disclosed herein. Any suitable number of series SAW resonators and shunt SAW resonators can be included in a transmit filter 85.

Figure 27:
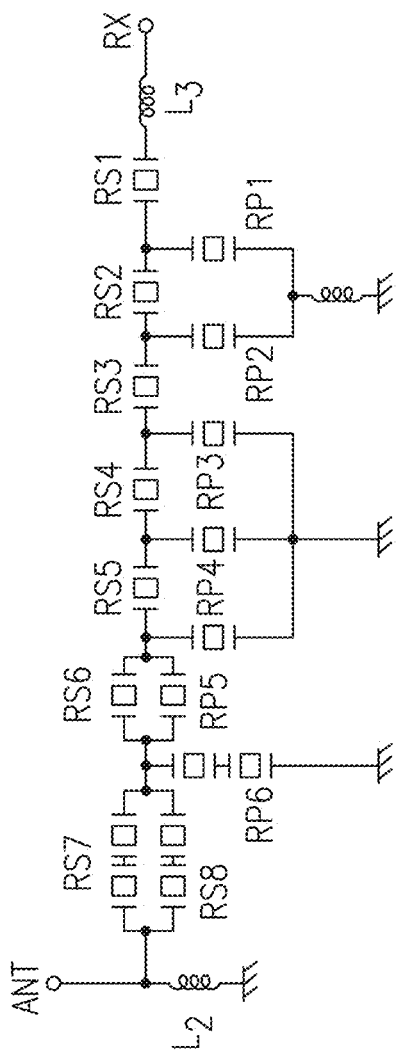
FIG. 27 is a schematic diagram of a receive filter that includes a surface acoustic wave resonator according to an embodiment.

FIG. 27 is a schematic diagram of a receive filter 90 that includes surface acoustic wave resonators according to an embodiment. The receive filter 90 can be a band pass filter. The illustrated receive filter 90 is arranged to filter a radio frequency signal received at an antenna port ANT and provide a filtered output signal to a receive port RX. Some or all of the SAW resonators RS1 to RS8 and/or RP1 to RP6 can be SAW resonators in accordance with any suitable principles and advantages disclosed herein. For instance, one or more of the SAW resonators of the receive filter 90 can be a surface acoustic wave resonator 2 of FIG. 2 or a surface acoustic wave resonator 5 of FIG. 6. Alternatively or additionally, one or more of the SAW resonators of the receive filter 90 can be any surface acoustic wave resonator disclosed herein. Any suitable number of series SAW resonators and shunt SAW resonators can be included in a receive filter 90.

Figure 28:
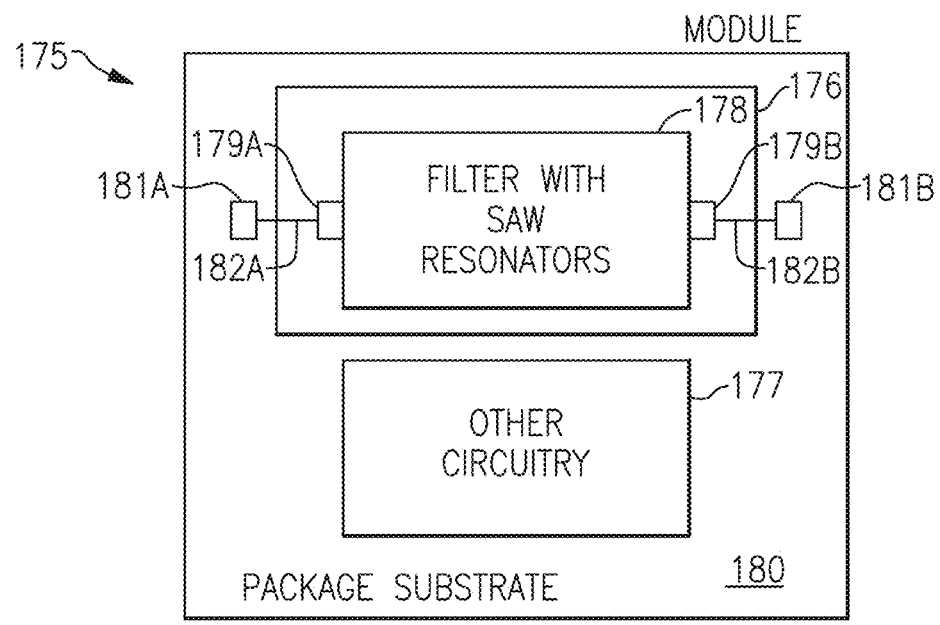
FIG. 28 is a schematic diagram of a radio frequency module that includes a surface acoustic wave resonator according to an embodiment.

FIG. 28 is a schematic diagram of a radio frequency module 175 that includes a surface acoustic wave component 176 according to an embodiment. The illustrated radio frequency module 175 includes the SAW component 176 and other circuitry 177. The SAW component 176 can include one or more SAW resonators with any suitable combination of features of the SAW resonators disclosed herein. The SAW component 176 can include a SAW die that includes SAW resonators.

The SAW component 176 shown in FIG. 28 includes a filter 178 and terminals 179A and 179B. The filter 178 includes SAW resonators. One or more of the SAW resonators can be implemented in accordance with any suitable principles and advantages of the surface acoustic wave resonator 2 of FIG. 2, a surface acoustic wave resonator 5 of FIG. 6, and/or any surface acoustic wave resonator disclosed herein. The filter 178 can be a TC-SAW filter arranged as a band pass filter to filter radio frequency signals with frequencies below about 3.5 GHz in certain applications. The terminals 179A and 178B can serve, for example, as an input contact and an output contact. The SAW component 176 and the other circuitry 177 are on a common packaging substrate 180 in FIG. 28. The package substrate 180 can be a laminate substrate. The terminals 179A and 179B can be electrically connected to contacts 181A and 181B, respectively, on the packaging substrate 180 by way of electrical connectors 182A and 182B, respectively. The electrical connectors 182A and 182B can be bumps or wire bonds, for example. The other circuitry 177 can include any suitable additional circuitry. For example, the other circuitry can include one or more one or more power amplifiers, one or more radio frequency switches, one or more additional filters, one or more low noise amplifiers, the like, or any suitable combination thereof. The radio frequency module 175 can include one or more packaging structures to, for example, provide protection and/or facilitate easier handling of the radio frequency module 175. Such a packaging structure can include an overmold structure formed over the packaging substrate 175. The overmold structure can encapsulate some or all of the components of the radio frequency module 175.

Figure 29:
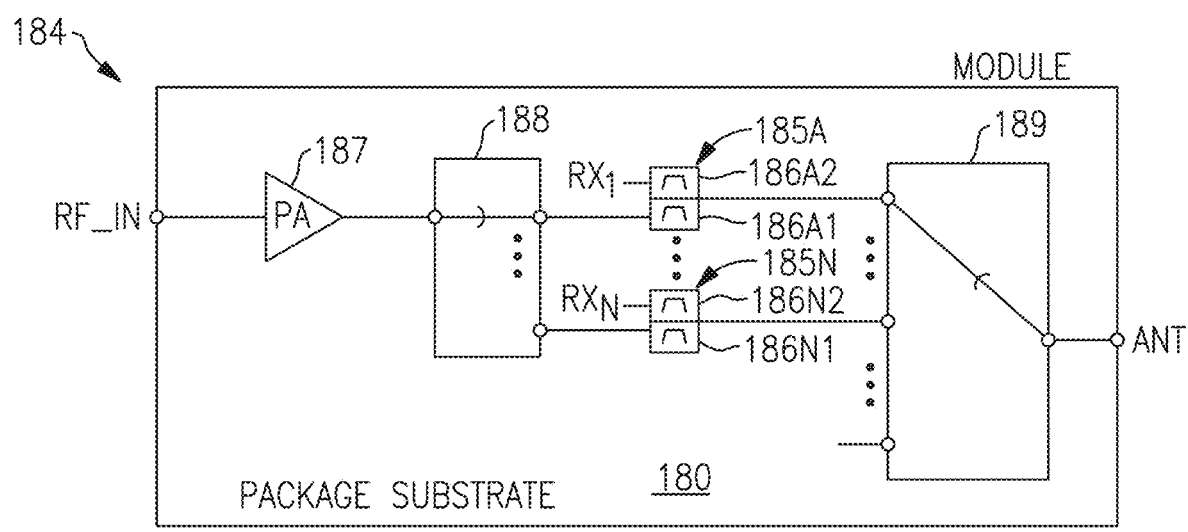
FIG. 29 is a schematic diagram of a radio frequency module that includes filters with surface acoustic wave resonators according to an embodiment.

FIG. 29 is a schematic diagram of a radio frequency module 184 that includes a surface acoustic wave component according to an embodiment. As illustrated, the radio frequency module 184 includes duplexers 185A to 185N that include respective transmit filters 186A1 to 186N1 and respective receive filters 186A2 to 186N2, a power amplifier 187, a select switch 188, and an antenna switch 189. In some instances, the module 184 can include one or more low noise amplifiers configured to receive a signal from one or more receive filters of the receive filters 186A2 to 186N2. The radio frequency module 184 can include a package that encloses the illustrated elements. The illustrated elements can be disposed on a common packaging substrate 180. The packaging substrate can be a laminate substrate, for example.

The duplexers 185A to 185N can each include two acoustic wave filters coupled to a common node. The two acoustic wave filters can be a transmit filter and a receive filter. As illustrated, the transmit filter and the receive filter can each be band pass filters arranged to filter a radio frequency signal. One or more of the transmit filters 186A1 to 186N1 can include one or more SAW resonators in accordance with any suitable principles and advantages disclosed herein. Similarly, one or more of the receive filters 186A2 to 186N2 can include one or more SAW resonators in accordance with any suitable principles and advantages disclosed herein. Although FIG. 29 illustrates duplexers, any suitable principles and advantages disclosed herein can be implemented in other multiplexers (e.g., quadplexers, hexaplexers, octoplexers, etc.) and/or in switch-plexers.

The power amplifier 187 can amplify a radio frequency signal. The illustrated switch 188 is a multi-throw radio frequency switch. The switch 188 can electrically couple an output of the power amplifier 187 to a selected transmit filter of the transmit filters 186A1 to 186N1. In some instances, the switch 188 can electrically connect the output of the power amplifier 187 to more than one of the transmit filters 186A1 to 186N1. The antenna switch 189 can selectively couple a signal from one or more of the duplexers 185A to 185N to an antenna port ANT. The duplexers 185A to 185N can be associated with different frequency bands and/or different modes of operation (e.g., different power modes, different signaling modes, etc.).

Figure 30:
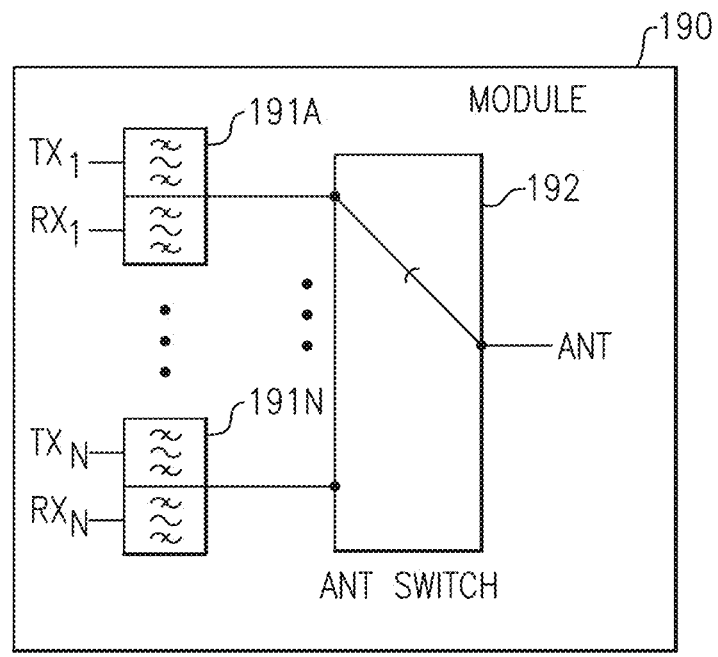
FIG. 30 is a schematic block diagram of a module that includes an antenna switch and duplexers that include a surface acoustic wave resonator according to an embodiment.

FIG. 30 is a schematic block diagram of a module 190 that includes duplexers 191A to 191N and an antenna switch 192. One or more filters of the duplexers 191A to 191N can include any suitable number of surface acoustic wave resonators in accordance with any suitable principles and advantages discussed herein. Any suitable number of duplexers 191A to 191N can be implemented. The antenna switch 192 can have a number of throws corresponding to the number of duplexers 191A to 191N. The antenna switch 192 can electrically couple a selected duplexer to an antenna port of the module 190.

Figure 31:
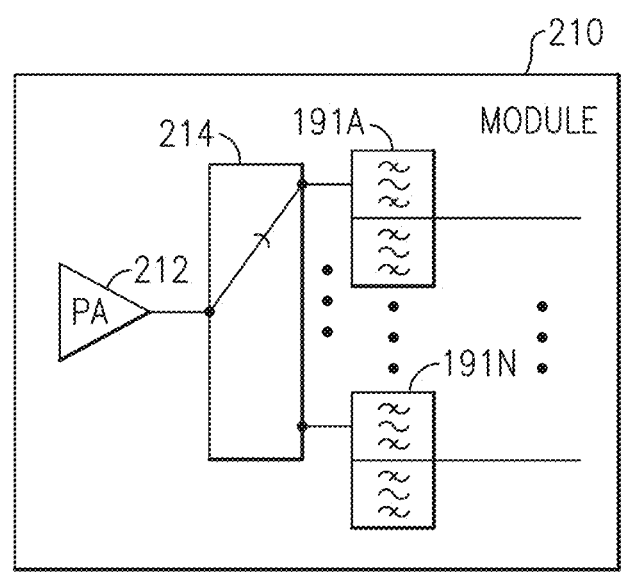
FIG. 31 is a schematic block diagram of a module that includes a power amplifier, a radio frequency switch, and duplexers that include a surface acoustic wave resonator according to an embodiment.

FIG. 31 is a schematic block diagram of a module 210 that includes a power amplifier 212, a radio frequency switch 214, and duplexers 191A to 191N in accordance with one or more embodiments. The power amplifier 212 can amplify a radio frequency signal. The radio frequency switch 214 can be a multi-throw radio frequency switch. The radio frequency switch 214 can electrically couple an output of the power amplifier 212 to a selected transmit filter of the duplexers 191A to 191N. One or more filters of the duplexers 191A to 191N can include any suitable number of surface acoustic wave resonators in accordance with any suitable principles and advantages discussed herein. Any suitable number of duplexers 191A to 191N can be implemented.

Figure 32A:
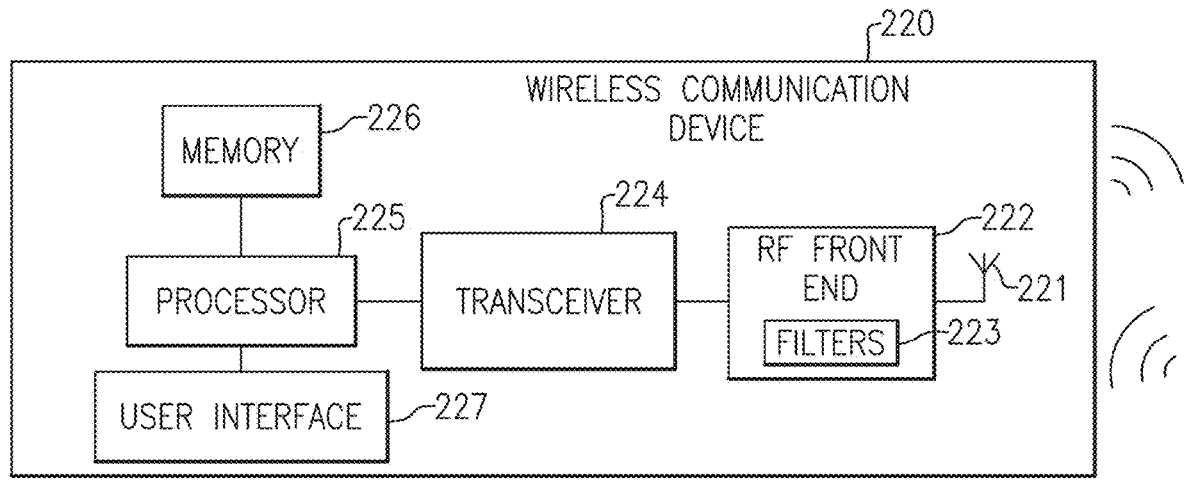
FIG. 32A is a schematic block diagram of a wireless communication device that includes a filter with a surface acoustic wave resonator in accordance with one or more embodiments.

FIG. 32A is a schematic diagram of a wireless communication device 220 that includes filters 223 in a radio frequency front end 222 according to an embodiment. The filters 223 can include one or more SAW resonators in accordance with any suitable principles and advantages discussed herein. The wireless communication device 220 can be any suitable wireless communication device. For instance, a wireless communication device 220 can be a mobile phone, such as a smart phone. As illustrated, the wireless communication device 220 includes an antenna 221, an RF front end 222, a transceiver 224, a processor 225, a memory 226, and a user interface 227. The antenna 221 can transmit/receive RF signals provided by the RF front end 222. Such RF signals can include carrier aggregation signals. Although not illustrated, the wireless communication device 220 can include a microphone and a speaker in certain applications.

The RF front end 222 can include one or more power amplifiers, one or more low noise amplifiers, one or more RF switches, one or more receive filters, one or more transmit filters, one or more duplex filters, one or more multiplexers, one or more frequency multiplexing circuits, the like, or any suitable combination thereof. The RF front end 222 can transmit and receive RF signals associated with any suitable communication standards. The filters 223 can include SAW resonators of a SAW component that includes any suitable combination of features discussed with reference to any embodiments discussed above.

The transceiver 224 can provide RF signals to the RF front end 222 for amplification and/or other processing. The transceiver 224 can also process an RF signal provided by a low noise amplifier of the RF front end 222. The transceiver 224 is in communication with the processor 225. The processor 225 can be a baseband processor. The processor 225 can provide any suitable base band processing functions for the wireless communication device 220. The memory 226 can be accessed by the processor 225. The memory 226 can store any suitable data for the wireless communication device 220. The user interface 227 can be any suitable user interface, such as a display with touch screen capabilities.

Figure 32B:
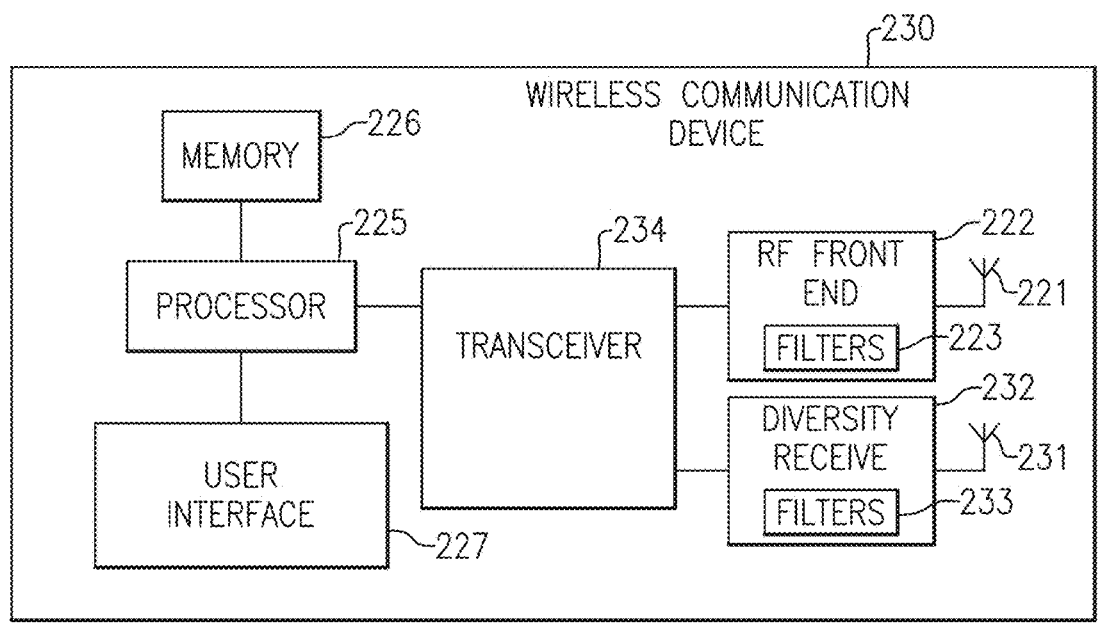
FIG. 32B is a schematic block diagram of another wireless communication device that includes a filter with a surface acoustic wave resonator in accordance with one or more embodiments.

FIG. 32B is a schematic diagram of a wireless communication device 230 that includes filters 223 in a radio frequency front end 222 and a second filter 233 in a diversity receive module 232. The wireless communication device 230 is like the wireless communication device 200 of FIG. 32A, except that the wireless communication device 230 also includes diversity receive features. As illustrated in FIG. 32B, the wireless communication device 230 includes a diversity antenna 231, a diversity module 232 configured to process signals received by the diversity antenna 231 and including filters 233, and a transceiver 234 in communication with both the radio frequency front end 222 and the diversity receive module 232. The filters 233 can include one or more SAW resonators that include any suitable combination of features discussed with reference to any embodiments discussed above.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a frequency range from about 30 kHz to 300 GHz, such as in a frequency range from about 450 MHz to 8.5 GHz.

Aspects of this disclosure can be implemented in various electronic devices. Examples of the electronic devices can include, but are not limited to, consumer electronic products, parts of the consumer electronic products such as die and/or acoustic wave filter assemblies and/or packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a personal digital assistant (PDA), a microwave, a refrigerator, an automobile, a stereo system, a DVD player, a CD player, a digital music player such as an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A surface acoustic wave resonator comprising:
a high impedance layer;
a piezoelectric layer over the high impedance layer, the piezoelectric layer having a cut angle in the range from 115° to 135° an acoustic impedance of the piezoelectric layer being lower than an acoustic impedance of the high impedance layer;

an interdigital transducer electrode over the piezoelectric layer; and a temperature compensation layer over the interdigital transducer electrode such that the interdigital transducer electrode is positioned between the piezoelectric layer and the temperature compensation layer, the surface acoustic wave resonator configured to generate a shear horizontal mode surface acoustic wave.

2. The surface acoustic wave resonator of claim 1 wherein the piezoelectric layer has a thickness in a range from $0.1\lambda$ to $0.5\lambda$.

3. The surface acoustic wave resonator of claim 1 wherein the piezoelectric layer is a lithium niobate layer.

4. The surface acoustic wave resonator of claim 1 further comprising a low impedance layer positioned between the high impedance layer and the piezoelectric layer, an acoustic impedance of the low impedance layer being lower than the acoustic impedance of the high impedance layer.

5. The surface acoustic wave resonator of claim 4 wherein the low impedance layer is a silicon dioxide layer.

6. The surface acoustic wave resonator of claim 5 wherein the low impedance layer has a thickness in a range from $0.01\lambda$ to $0.3\lambda$.

7. The surface acoustic wave resonator of claim 1 wherein the high impedance layer is a silicon layer.

8. The surface acoustic wave resonator of claim 1 wherein the temperature compensation layer is a silicon dioxide layer, and the silicon dioxide layer has a thickness in a range from $0.01\lambda$ to $0.4\lambda$.

9. The surface acoustic wave resonator of claim 1 further comprising a silicon nitride layer over the temperature compensation layer.

10. The surface acoustic wave resonator of claim 1 wherein a reflection coefficient of the surface acoustic wave resonator is at least 0.9 for a frequency range from 2 GHz to 3.75 GHz.

11. The surface acoustic wave resonator of claim 1 wherein a reflection coefficient of the surface acoustic wave resonator is at least 0.9 for a frequency range from above a pass band of a filter.

12. A surface acoustic wave resonator comprising:
a high impedance layer;
a lithium niobate layer over the high impedance layer, the lithium niobate layer having a cut angle in the range from 115° to 135°, an acoustic impedance of the lithium niobate layer lower than an acoustic impedance of the high impedance layer;
an interdigital transducer electrode over the piezoelectric layer; and
a first silicon dioxide layer over the interdigital transducer electrode such that the interdigital transducer electrode is positioned between the piezoelectric layer and the first silicon dioxide layer, the surface acoustic wave resonator configured to generate a shear horizontal mode surface acoustic wave.

13. The surface acoustic wave resonator of claim 12 wherein the lithium niobate layer has a thickness in a range from $0.1\lambda$ to $0.5\lambda$.

14. The surface acoustic wave resonator of claim 12 wherein the second silicon dioxide layer has a thickness in a range from $0.01\lambda$ to $0.4\lambda$.

15. The surface acoustic wave resonator of claim 12 wherein the high impedance layer is a silicon layer.

16. The surface acoustic wave resonator of claim 15 wherein the first silicon dioxide layer has a thickness in a range from $0.01\lambda$ to $0.3\lambda$.

17. The surface acoustic wave resonator of claim 12 wherein a reflection coefficient of the surface acoustic wave resonator is at least 0.9 for a frequency range from 2 GHz to 3.75 GHz.

18. The acoustic wave resonator of claim 12 wherein a reflection coefficient of the surface acoustic wave resonator is at least 0.9 for a frequency range from above a pass band of a filter that includes the Rayleigh mode surface acoustic wave resonator to 3.75 GHz.

19. The surface acoustic wave resonator of claim 12 wherein the interdigital transducer electrode includes two layers.

20. The surface acoustic wave resonator of claim 12 further comprising a low impedance layer positioned between the high impedance layer and the piezoelectric layer, an acoustic impedance of the low impedance layer being lower than the acoustic impedance of the high impedance layer.

* * * * *